(12) United States Patent
Kawahara et al.

(10) Patent No.: US 8,878,330 B2
(45) Date of Patent: Nov. 4, 2014

(54) INTEGRATED HIGH VOLTAGE DIVIDER

(75) Inventors: Hideaki Kawahara, Tokyo (JP); Marie Denison, Plano, TX (US); Sameer Pendharkar, Allen, TX (US); Philip L. Hower, Concord, MA (US); John Lin, Chelmsford, MA (US); Robert A. Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/567,456

(22) Filed: Aug. 6, 2012

(65) Prior Publication Data
US 2013/0032922 A1 Feb. 7, 2013

Related U.S. Application Data

(60) Provisional application No. 61/515,186, filed on Aug. 4, 2011.

(51) Int. Cl.
*H01L 29/02* (2006.01)
*H01L 21/761* (2006.01)
*H01L 21/266* (2006.01)

(52) U.S. Cl.
CPC .............. *H01L 21/761* (2013.01); *H01L 21/266* (2013.01)

USPC ........... 257/489; 257/488; 257/492; 257/493; 257/E29.011; 438/140

(58) Field of Classification Search
CPC . H01L 29/7835; H01L 27/0802; H01L 28/20; H01L 29/0692; H01L 29/405; H01L 29/0634; H01L 29/402; H01L 29/404; H01L 29/407
See application file for complete search history.

(56) References Cited

U.S. PATENT DOCUMENTS

| 2007/0114608 A1* | 5/2007 | Letavic | 257/347 |
| 2012/0091529 A1* | 4/2012 | Cheng et al. | 257/360 |

* cited by examiner

*Primary Examiner* — Benjamin Sandvik
*Assistant Examiner* — Leslie Pilar Cruz
(74) *Attorney, Agent, or Firm* — Jacqueline J. Garner; Frederick J. Telecky, Jr.

(57) ABSTRACT

An integrated circuit containing a voltage divider having an upper resistor of unsilicided gate material over field oxide around a central opening and a drift layer under the upper resistor, an input terminal coupled to an input node of the upper resistor adjacent to the central opening in the field oxide and coupled to the drift layer through the central opening, a sense terminal coupled to a sense node on the upper resistor opposite from the input node, a lower resistor with a sense node coupled to the sense terminal and a reference node, and a reference terminal coupled to the reference node. A process of forming the integrated circuit containing the voltage divider.

22 Claims, 23 Drawing Sheets

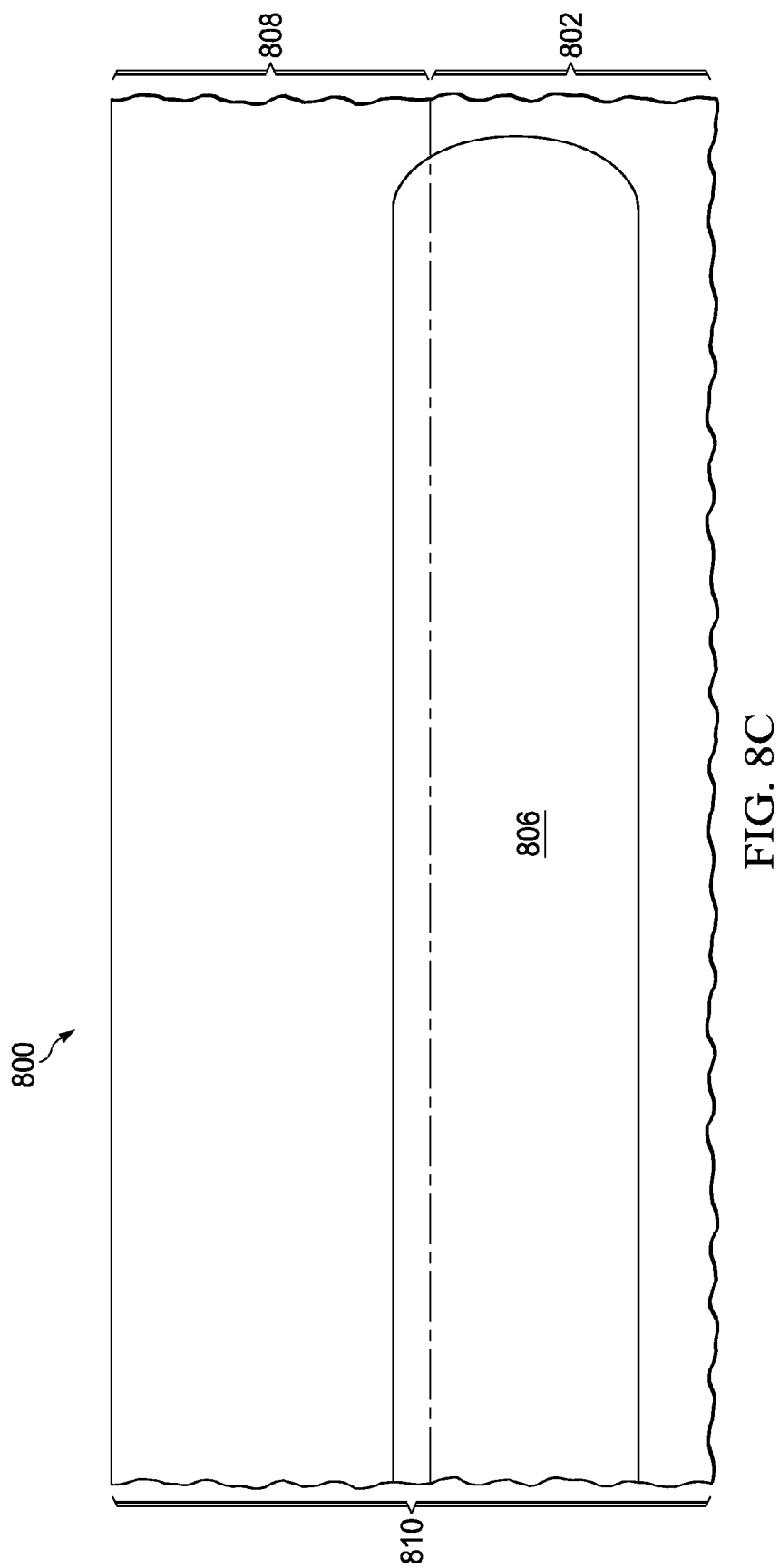

INTEGRATED HIGH VOLTAGE DIVIDER

CROSS-REFERENCE TO RELATED APPLICATIONS

The following co-pending patent application is related and hereby incorporated by reference: U.S. patent application Ser. No. 13/567,340 filed Aug. 6, 2012, filed simultaneously with this application).

FIELD OF THE INVENTION

This invention relates to the field of integrated circuits. More particularly, this invention relates to voltage dividers in integrated circuits.

BACKGROUND OF THE INVENTION

An integrated circuit may contain a voltage divider which has an upper resistor connected in series with a lower resistor, with a sense terminal at the connection between the two resistors. An input voltage is applied to an input terminal on the upper resistor opposite from the sense terminal. A reference voltage is applied to a reference terminal on the lower resistor opposite from the sense terminal. It may be desirable to apply an input voltage higher than a breakdown voltage of dielectric materials in the integrated circuit adjacent to the upper resistor, while providing a sense voltage at the sense terminal close to an operating voltage of circuits in the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed to contain a voltage divider having an upper resistor disposed on field oxide over a drift layer in the substrate of the integrated circuit. A lower resistor is formed in series with the upper resistor, electrically coupled to the upper resistor through a sense terminal. An input terminal is electrically coupled to an input node of the upper resistor opposite from the sense terminal and to the drift layer adjacent to the input node. The upper resistor and the drift layer, and any RESURF layers abutting the drift layer, are configured so as to provide an electric field in the field oxide and the substrate below breakdown conditions. The upper resistor may be configured in a multiple turn closed loop configuration such as a spiral to provide a desired electrical resistance.

DESCRIPTION OF THE VIEWS OF THE DRAWING

FIG. 8A through FIG. 8D are cross sections of an integrated circuit containing a voltage divider formed according to a further embodiment, depicted in successive stages of fabrication.

DETAILED DESCRIPTION OF EXAMPLE EMBODIMENTS

Figure 1:
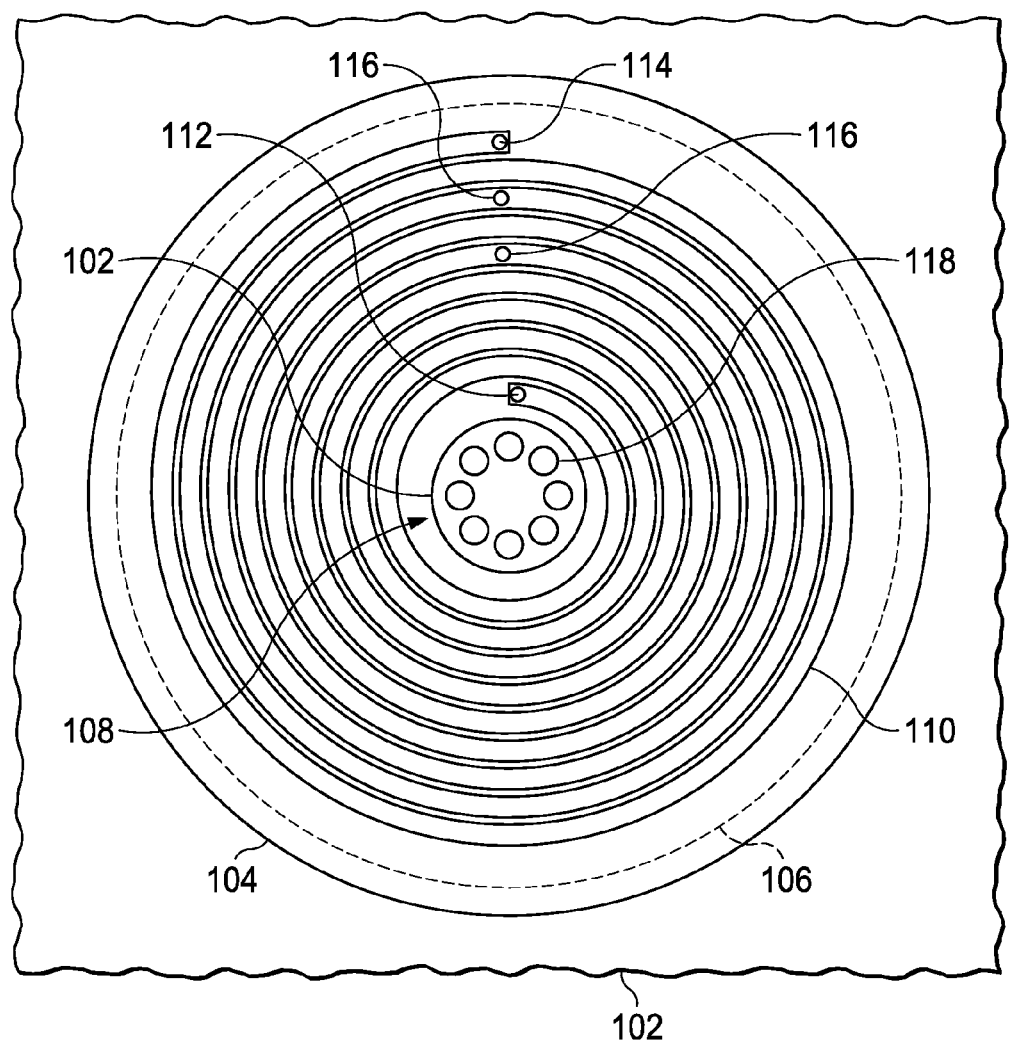
FIG. 1 through FIG. 5 are top views of integrated circuits containing voltage dividers formed according to embodiments, depicting various configurations of upper resistors.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a voltage divider may be formed by a process including forming an upper resistor of gate material or thin film resistor material on a field oxide element, and forming a drift layer in the substrate of the integrated circuit under the upper resistor. A lower resistor is formed in series with the upper resistor, and a sense terminal is formed which electrically couples a sense node of the upper resistor to a sense node at one end of the lower resistor. An input terminal is formed which is electrically coupled to an input node of the upper resistor opposite from the sense node. The input terminal is electrically coupled to the drift layer adjacent to the input node on the upper resistor. A reference terminal is formed which is electrically coupled to a reference node on the lower resistor at an opposite end of the lower resistor from the sense node. A spatial arrangement of the upper resistor and doping distributions in the drift layer, and any RESURF layers abutting the drift layer, are configured so as to provide an electric field in the field oxide element and the substrate below breakdown conditions. The upper resistor may be configured in a multiple turn closed loop configuration such as a spiral, rounded-rectangle spiral, or fingered spiral configuration, to provide a desired electrical resistance.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

For the purposes of this description, the term "unsilicided" in reference to an element in an integrated circuit will be understood to mean the element is free of metal silicide on all surfaces of the element.

For the purposes of this description, the term "substantially equal" as applied to structures and elements formed in an integrated circuit is understood to mean equal within fabrication tolerances used to fabricate the integrated circuit.

For the purposes of this description, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential.

FIG. 1 through FIG. 5 are top views of integrated circuits containing voltage dividers formed according to embodiments, depicting various configurations of upper resistors. Referring to FIG. 1, an integrated circuit 100 is formed on a semiconductor substrate 102. An element of field oxide 104 is formed at a top surface of the substrate 102. A drift layer 106 is formed in the substrate 102 under the field oxide 104. The field oxide 104 has a central opening 108 which exposes the drift layer 106. An upper resistor 110 is formed of gate material such as unsilicided polysilicon or thin film resistor material over the field oxide 104 and the drift layer 106 and around the central opening 108. The upper resistor 110 may be formed concurrently with gates of NMOS and/or PMOS transistors in the integrated circuit. The upper resistor 110 has at least one input node 112 located at a central end of the resistor adjacent to the central opening 108, and at least one sense node 114 located at an outer end of the resistor. The upper resistor 110 may have optional alternate sense nodes 116 located along its length. The nodes 112, 114 and 116 are locations on the upper resistor 110 rather than physical structures. Upper resistor 1010 is shown as spiral shaped in FIG. 1. Alternative configurations may be employed such as those shown in FIG. 2 through FIG. 5 and discussed further below. Metal silicide, such as titanium silicide, cobalt silicide or nickel silicide, is not formed on the upper resistor 110 except possibly at the nodes 112, 114 and 116. The input node 112 is electrically coupled to the drift layer 106 at one or more drift layer contacts 118 in the central opening, by an input terminal, not shown. A lower resistor, not shown, is electrically coupled in series to the sense node 114. Additional optional lower resistors, not shown, may be coupled to the optional alternate sense nodes 116 if formed.

During operation of the integrated circuit 100, an input voltage is applied to the input node 112 of the upper resistor 110 and to the drift layer contacts 118. A reference voltage is applied to a reference node on the lower resistor opposite the sense terminal. An electric potential in the upper resistor 110 decreases from a value equal to the input voltage at the input node 112 to a value close to the reference voltage at the sense node 114. The spiral configuration of the upper resistor 110 results in the electric potential in the upper resistor 110 being approximately radially uniform and approximately linearly decreasing as a function of distance from the center of the spiral. The drift layer 106 depletes so that an electric potential in the drift layer 106 approximately matches the electric potential in the upper resistor 110, providing an electric field in the field oxide 104 which is below a breakdown field value of the field oxide 104. A doping distribution in the drift layer 106 is formed so that an electric field in the substrate 102 including the drift layer 106 is below a breakdown field value of the substrate 102, for example less than 20 volts/micron.

Overall dimensions of the upper resistor 110 are selected to provide a desired total resistance of the upper resistor 110. For example, a voltage divider having a spiral upper resistor and capable of operating with a 700 volt input voltage may have a diameter of the central opening 108 between 80 and 200 microns, a width of the gate material in each turn between 0.5 and 2 microns, and a total number of turns between 12 and 32 turns. In one version of the instant embodiment, resistance values of the upper resistor 110 and lower resistor are selected to provide a sense potential at the sense terminal within a desired range. For example, in a version in which 700 volts are applied to the input node 112 and Vss is applied to the reference node of the lower resistor, the resistance values of the upper resistor 110 and lower resistor may be selected to provide a sense potential between Vdd and Vdd+Vss/2. Spacing between adjacent lines of gate material of the upper resistor 110 are selected so that an electric field between the adjacent lines is less than a breakdown field of dielectric material between the adjacent lines. For example, in a version in which 700 volts are applied to the input node 112 of an upper resistor having between 12 and 32 turns, the spacing between adjacent lines of gate material may be between 0.5 and 1.5 microns.

Figure 2:
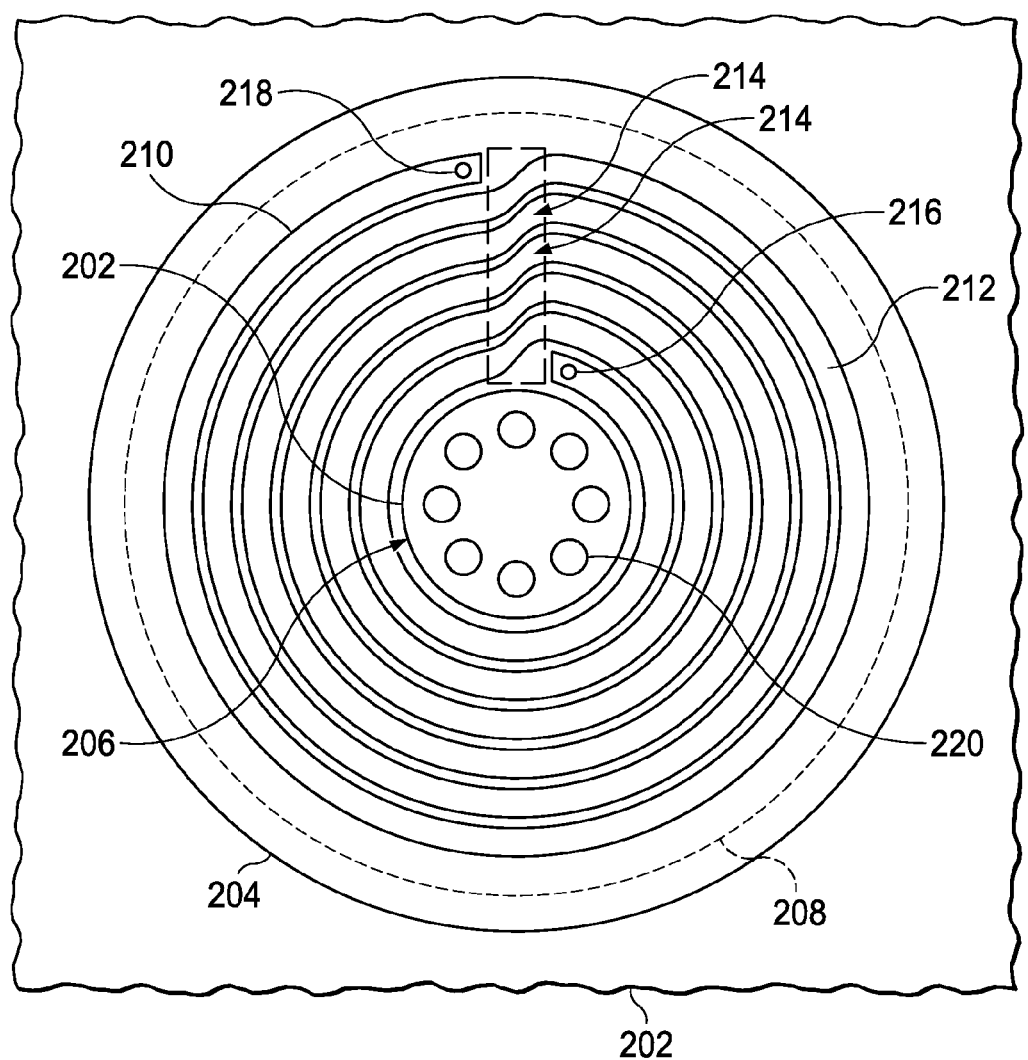

FIG. 2 depicts an upper resistor in a linked-arc spiral configuration. An integrated circuit 200 is formed on a semiconductor substrate 202. Field oxide 204 is formed at a top surface of the substrate 202 with a central opening 206. A drift layer 208 is formed in the substrate under the field oxide 204 and central opening 206. An upper resistor 210 is formed of gate material or thin film resistor material over the field oxide 204 in a linked-arc spiral configuration, in which each turn of the spiral has a circular arc 212 linked to adjacent turns by diagonal links 214. The upper resistor 210 has an input node 216 and a sense node 218 as described in reference to FIG. 1. The input node 216 is electrically coupled to the drift region through drift region contacts 220 as described in reference to FIG. 1. Conditions for lateral dimensions of the upper resistor 210 and a doping distribution in the drift layer 208, and operation of the integrated circuit 200, are as described in reference to FIG. 1.

Figure 3:
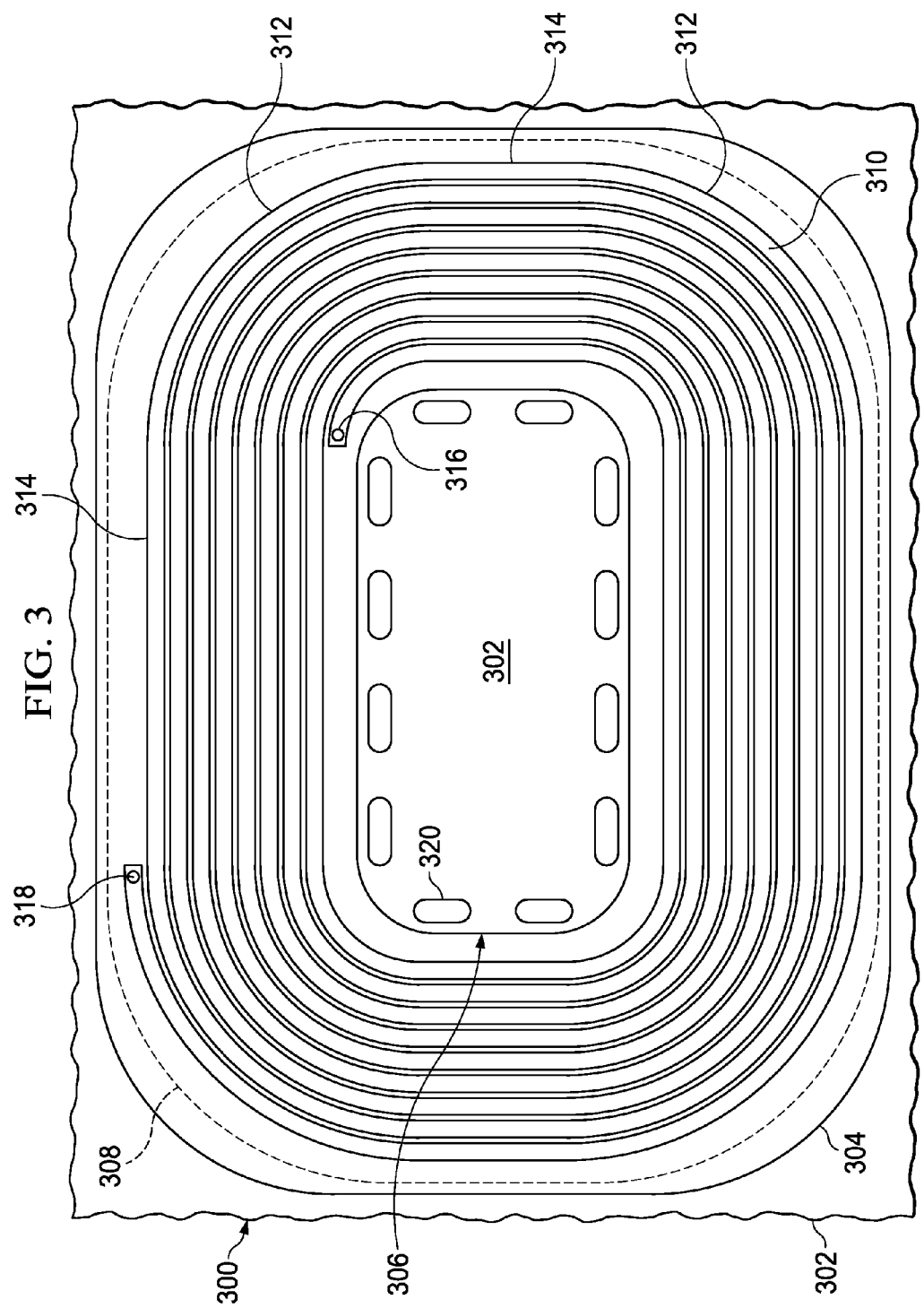

FIG. 3 depicts an upper resistor in a rounded-rectangle spiral configuration. An integrated circuit 300 is formed on a semiconductor substrate 302. Field oxide 304 is formed at a top surface of the substrate 302 with a central opening 306. A drift layer 308 is formed in the substrate under the field oxide 304 and central opening 306. An upper resistor 310 is formed of gate material or thin film resistor material over the field oxide 304 in a rounded-rectangle spiral configuration, in which each turn of the spiral has alternating circular arcs 312 and straight lines 314. The upper resistor 310 has an input node 316 and a sense node 318 as described in reference to FIG. 1. The input node 316 is electrically coupled to the drift region through drift region contacts 320 as described in reference to FIG. 1. Conditions for lateral dimensions of the upper resistor 310 and a doping distribution in the drift layer 308, and operation of the integrated circuit 300, are as described in reference to FIG. 1.

Figure 4:
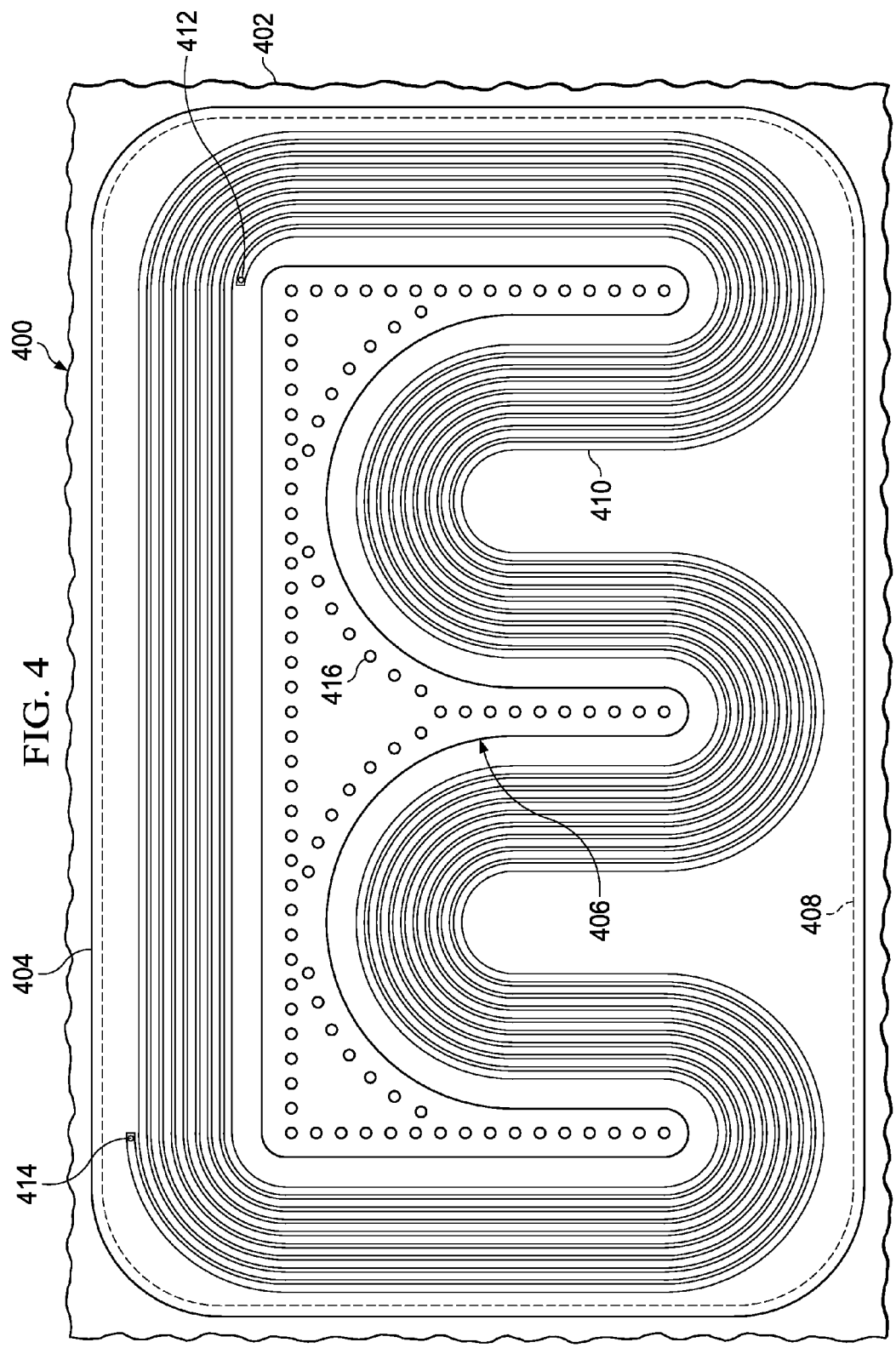

FIG. 4 depicts an upper resistor in a multi-fingered spiral configuration. An integrated circuit 400 is formed on a semiconductor substrate 402. Field oxide 404 is formed at a top surface of the substrate 402 with a central opening 406. A drift layer 408 is formed in the substrate under the field oxide 404 and central opening 406. An upper resistor 410 is formed of gate material or thin film resistor material over the field oxide 404 in a multi-fingered spiral configuration. The upper resistor 410 has an input node 412 and a sense node 414 as described in reference to FIG. 1. The input node 412 is electrically coupled to the drift region through drift region contacts 416 as described in reference to FIG. 1. Conditions for lateral dimensions of the upper resistor 410 and a doping distribution in the drift layer 408, and operation of the integrated circuit 400, are as described in reference to FIG. 1.

Figure 5:
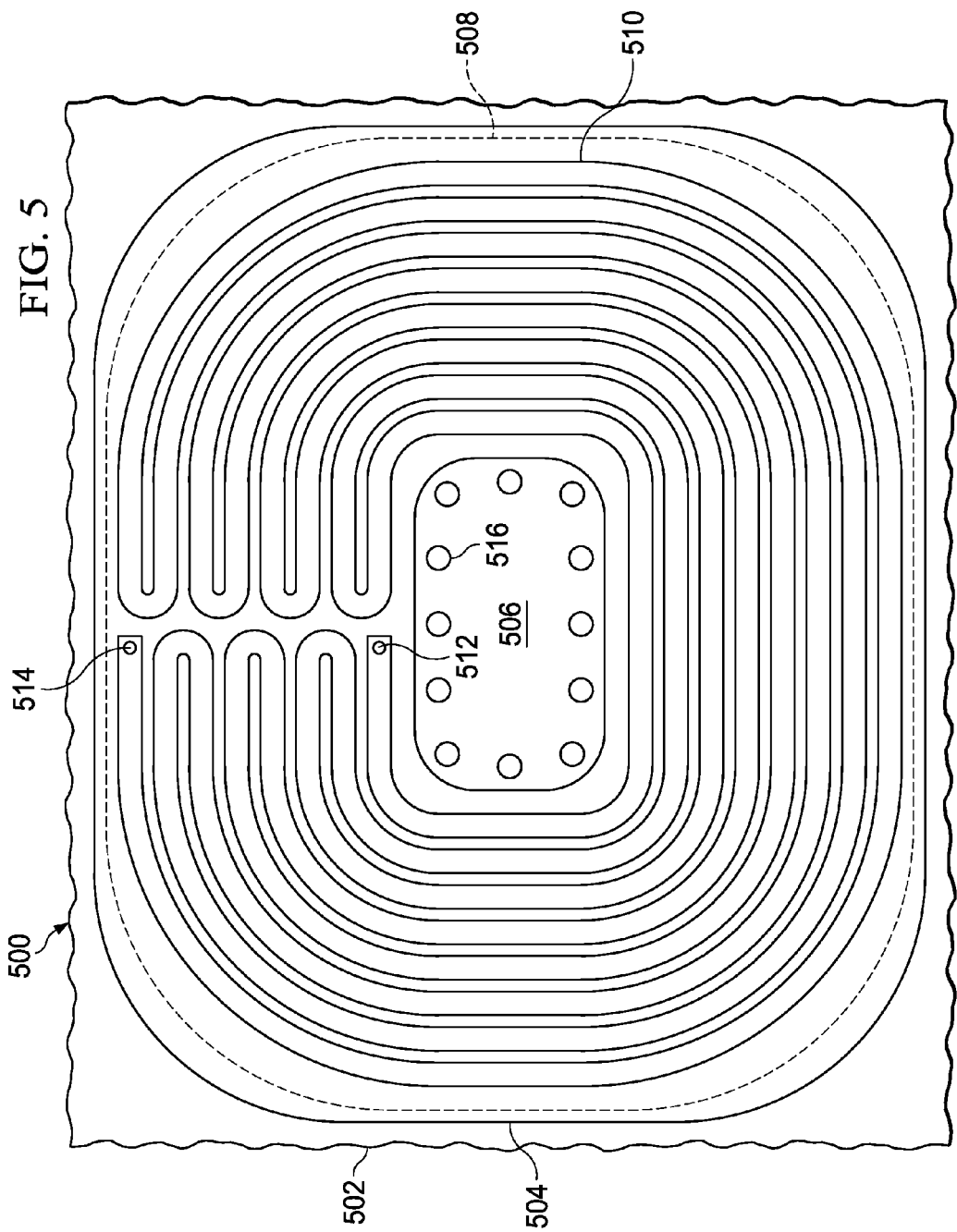

FIG. 5 depicts an upper resistor in a serpentine collar configuration. An integrated circuit 500 is formed on a semiconductor substrate 502. Field oxide 504 is formed at a top surface of the substrate 502 with a central opening 506. A drift layer 508 is formed in the substrate under the field oxide 504 and central opening 506. An upper resistor 510 is formed of gate material or thin film resistor material over the field oxide 504 in a serpentine collar configuration, which does not have spiral turns, and hence may provide a lower inductance. The upper resistor 510 has an input node 512 and a sense node 514 as described in reference to FIG. 1. The input node 512 is electrically coupled to the drift layer 508 through drift layer contacts 516 as described in reference to FIG. 1. Conditions for lateral dimensions of the upper resistor 510 and a doping distribution in the drift layer 508, and operation of the integrated circuit 500, are as described in reference to FIG. 1.

An integrated circuit containing a voltage divider with an upper resistor having a different configuration than the embodiments discussed in reference to FIG. 1 through FIG. 5 is within the scope of the instant invention. For example, other serpentine configurations of upper resistors may be used to provide desired values of total resistance and inductance.

Figure 6A:
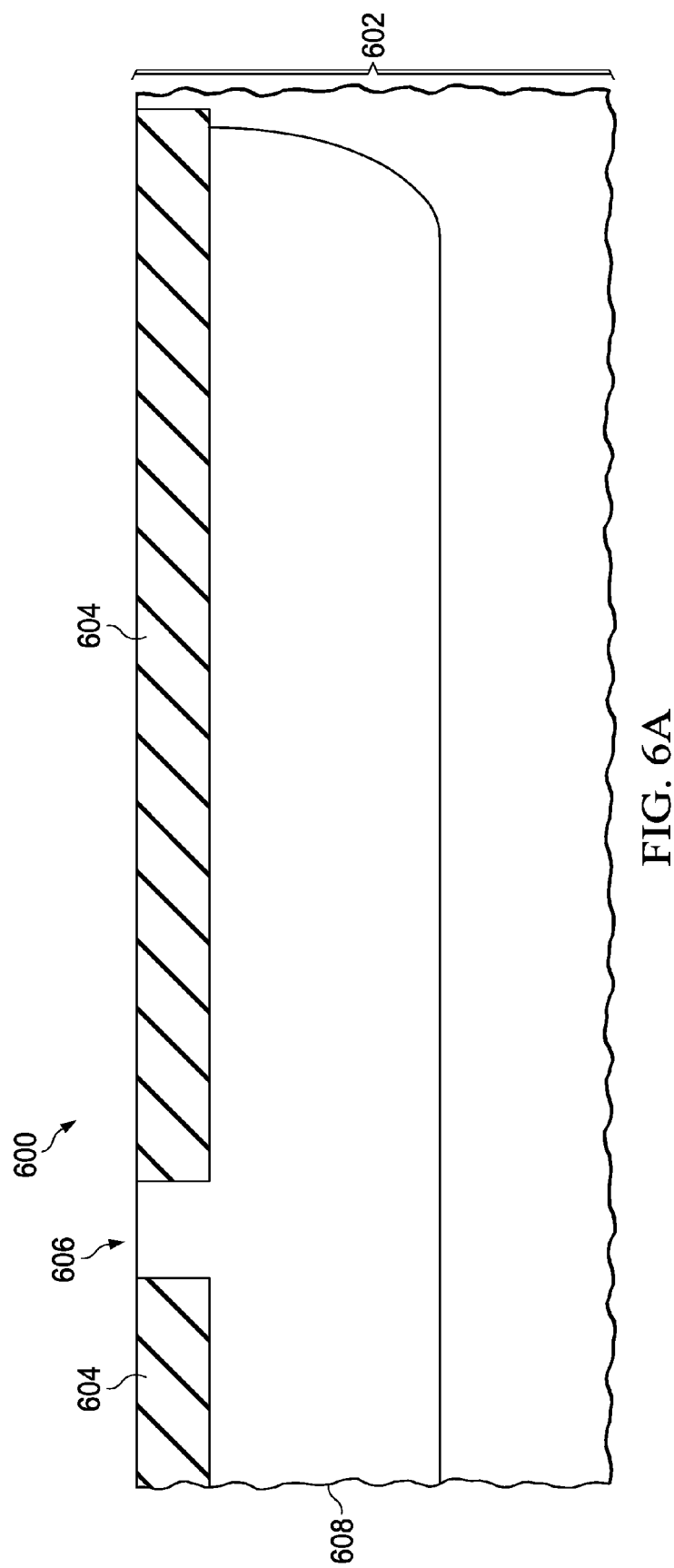
FIG. 6A through FIG. 6D are cross sections of an integrated circuit containing a voltage divider formed according to an embodiment, depicted in successive stages of fabrication.

FIG. 6A through FIG. 6D are cross sections of an integrated circuit containing a voltage divider formed according to an embodiment, depicted in successive stages of fabrication. Referring to FIG. 6A, the integrated circuit 600 is formed in and on a semiconductor substrate 602 which may be a single crystal silicon wafer, a silicon-on-insulator (SOI) wafer, a hybrid orientation technology (HOT) wafer with regions of different crystal orientations, or other material appropriate for fabrication of the integrated circuit 600. In versions of the instant embodiment discussed herein, the substrate 602 is p-type. It will be recognized that a voltage divider may be formed in an integrated circuit having an n-type substrate by an appropriate change in polarities or conductivity types and implanted dopants. Field oxide 604 is formed at a top surface of the substrate 602 in an area defined for an upper resistor of the voltage divider. The field oxide 604 may be, for example, silicon dioxide between 250 and 600 nanometers thick, formed by shallow trench isolation (STI) or local oxidation of silicon (LOCOS) processes. In STI processes, silicon dioxide may be deposited by high density plasma (HDP) or high aspect ratio process (HARP). The field oxide 604 has a central opening 606, for example as described any of the embodiment discussed in reference to FIG. 1 through FIG. 5, which exposes the substrate 602.

An n-type drift layer 608 is formed in the substrate 602 under the field oxide 604 and the central opening 606. In the instant embodiment, the drift layer 608 contacts a bottom surface of the field oxide 604. The drift layer 608 may be formed, for example, by ion implanting n-type dopants such as phosphorus at a dose between $3 \times 10^{11}$ atoms/cm$^2$ and $3 \times 10^{12}$ atoms/cm$^2$, followed by an anneal operation which heats the substrate 602 above 1000° C. in an anneal furnace so as to activate the n-type dopants. A depth of the drift layer 608 may be between 1 and 3 microns. In one version of the instant embodiment, the drift layer 608 may extend to the top surface of the substrate 602 in the central opening 606 as depicted in FIG. 6A. In another version, the drift layer 608 may not necessarily extend to the top surface of the substrate 602. In one version, the field oxide 604 may overlap an outer edge of the drift layer 608 as depicted in FIG. 6A. In another version, the drift layer 608 may extend past an outer edge of the field oxide 604.

Figure 6B:
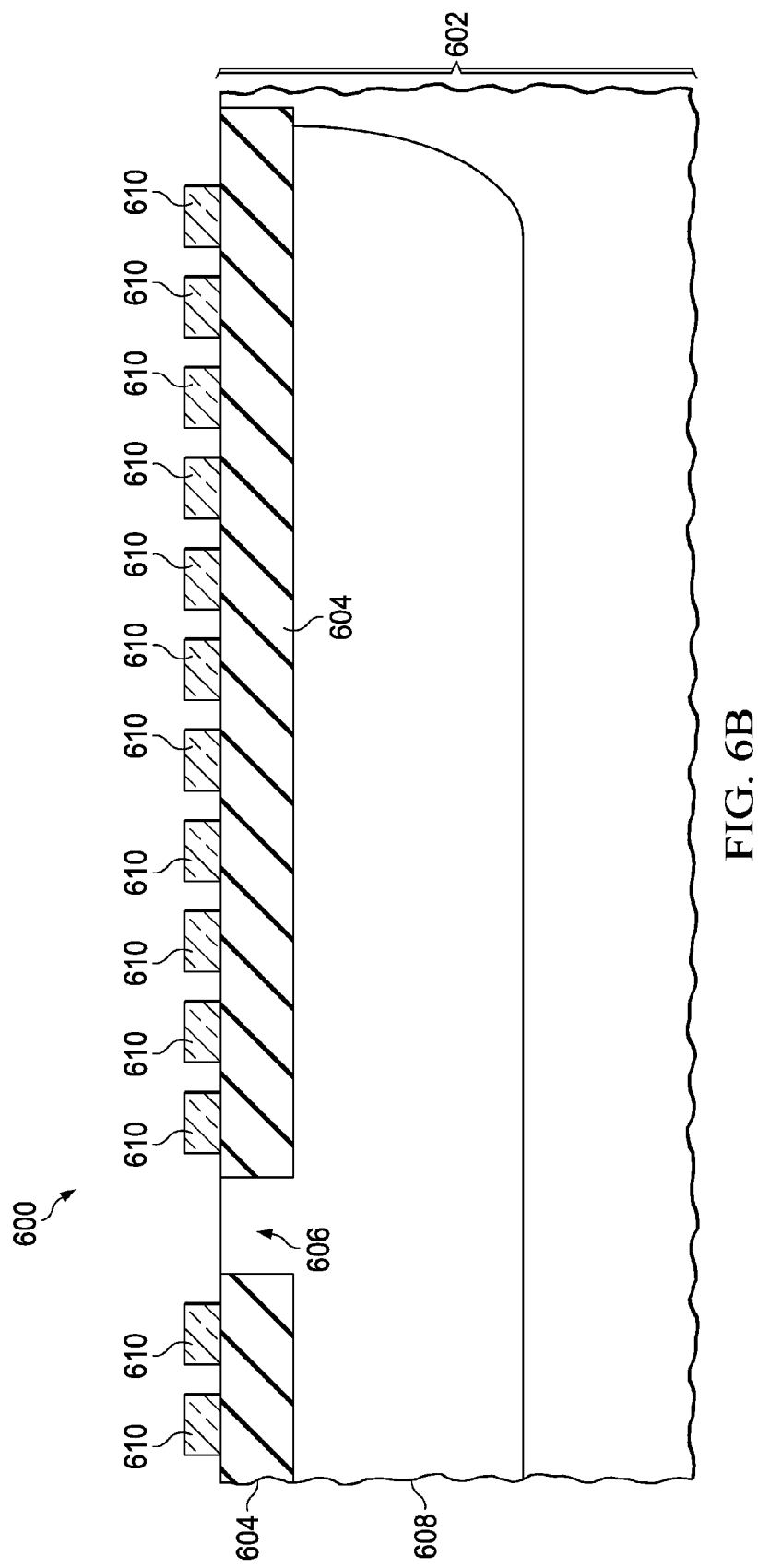

Referring to FIG. 6B, an upper resistor 610 is formed over the field oxide 604 around the central opening 606, as shown in any of FIG. 1 through FIG. 5. In one version of the instant embodiment, the upper resistor 610 is formed of gate material, such as unsilicided polysilicon, and may be formed concurrently with gates of NMOS and/or PMOS transistors, not shown, in the integrated circuit 600. In an alternate version, the upper resistor 610 is formed of thin film resistor material such as an alloy of silicon and chromium (SiCr), an alloy of nickel and chromium (NiCr) or an alloy of tantalum and nitrogen (TaN). The upper resistor may be formed, for example, by forming a layer of gate material on an existing top surface of the integrated circuit 600. An optional ion implant process may be performed on the integrated circuit which implants n-type and/or p-type dopants into a portion or all of the gate material layer. A gate etch mask may be formed over the gate material layer so as to cover an area defined for the upper resistor, and possibly areas defined for NMOS and/or PMOS transistor gates. The gate etch mask may include photoresist, and possible one or more anti-reflection layers. A gate etch process may be performed on the integrated circuit 600 which removed unwanted material from the gate material layer in areas exposed by the gate etch mask. The gate etch process may include one or more reactive ion etch (RIE) operations which expose the integrated circuit 600 to fluorine-containing species.

Figure 6C:
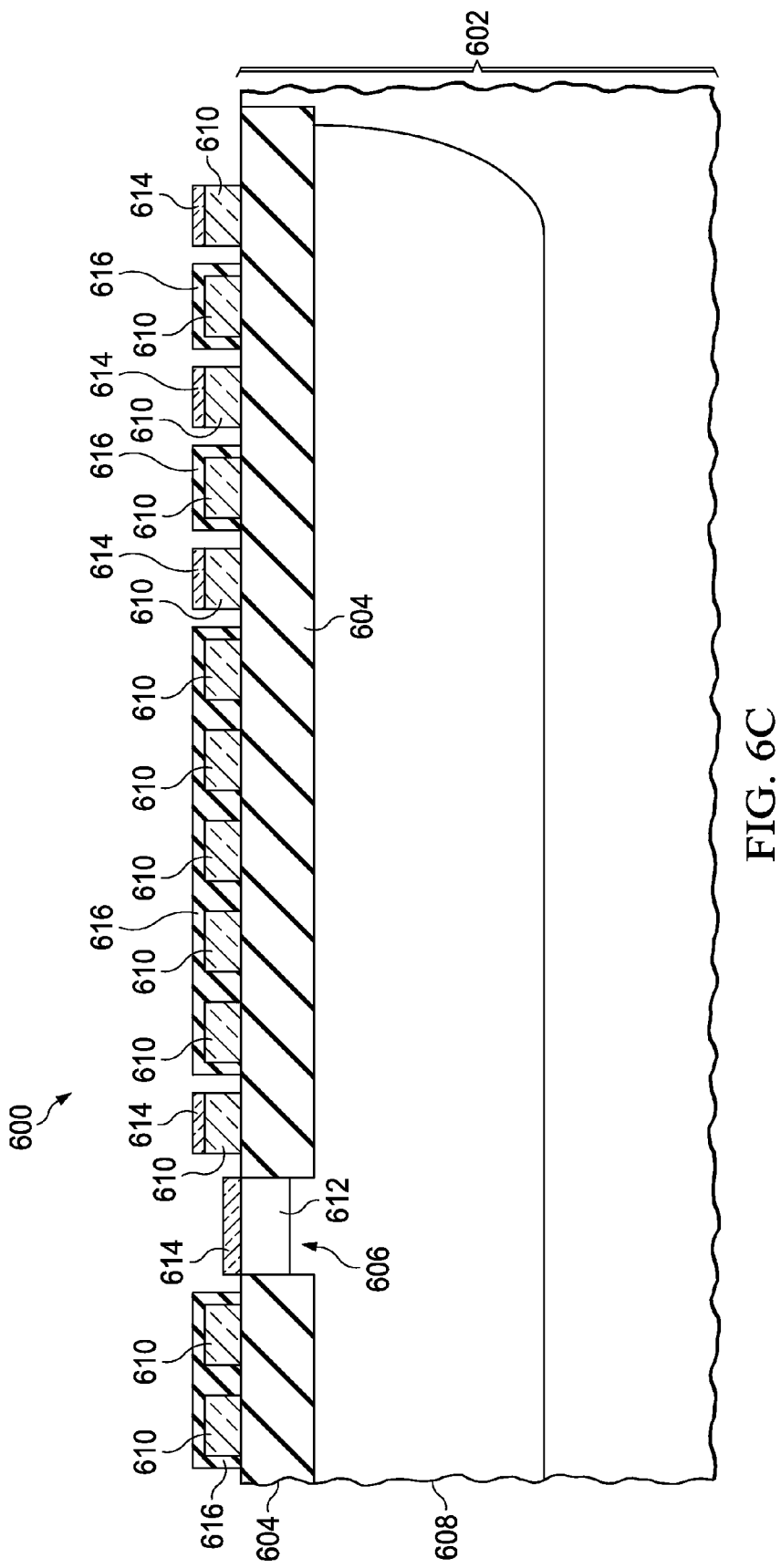

Referring to FIG. 6C, an n-type drift layer contact region 612 is formed in the central opening 606 having an average doping density at least twice an average doping density in the drift layer 608. The drift layer contact region 612 contacts the drift layer 608 to provide an electrical connection from the top surface of the substrate 602 in the central opening 606 to the drift layer 608. The drift layer contact region 612 may be formed, for example, by ion implanting n-type dopants such as phosphorus and arsenic, and possible antimony, into the substrate 602 in the central opening 606, followed by an anneal operation which heats the substrate 602 above 1050° C. in a rapid thermal processing tool. In one version of the instant embodiment, the drift layer contact region 612 may be formed concurrently with source and drain layers of NMOS transistors, not shown, in the integrated circuit 600.

After formation of the drift layer contact region 612, metal silicide layers 614 may be formed on exposed areas of the substrate 602 and gates of NMOS and/or PMOS transistors, not shown. The metal silicide layers 614 may be formed by depositing a layer of metal, such as titanium, cobalt or nickel, on a top surface of the integrated circuit 600, heating the integrated circuit 600 to react a portion of the metal with exposed silicon in active areas of the integrated circuit 600, and selectively removing unreacted metal from the integrated circuit 600 surface, commonly by exposing the integrated circuit 600 to wet etchants including a mixture of an acid and hydrogen peroxide.

Metal silicide is prevented from forming on the upper resistor 610, except possibly on an input node 616, a sense node 618 and alternate sense nodes 620 if present, by forming a silicide blocking dielectric layer 622 over the upper resistor. The silicide blocking dielectric layer 622 may be formed concurrently with gate sidewall spacers on gates of the NMOS and/or PMOS transistors.

Figure 6D:
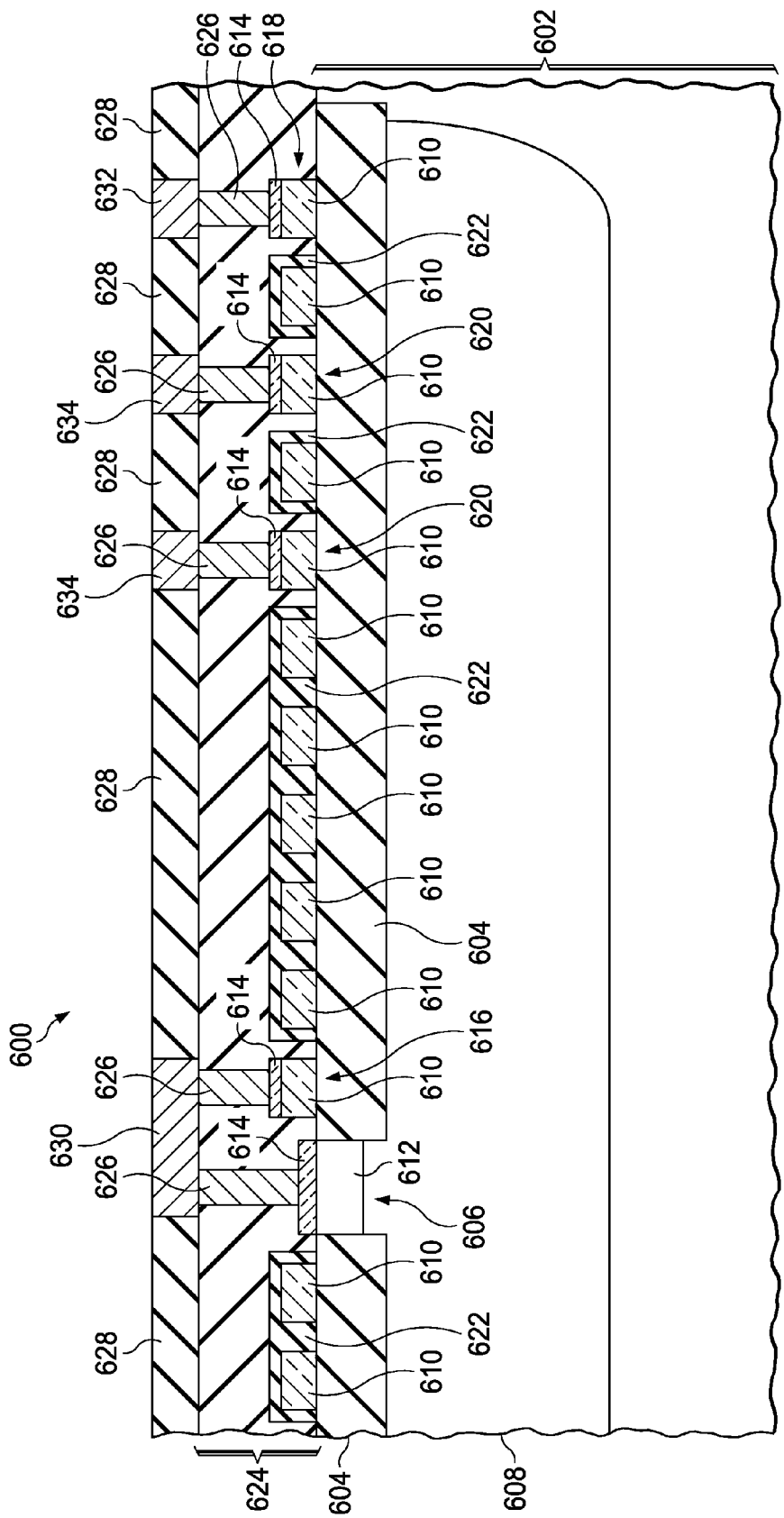

Referring to FIG. 6D, metal interconnects and dielectric layers are formed on the integrated circuit 600. A pre-metal dielectric (PMD) layer 624 is formed over an existing top surface of the integrated circuit 600. The PMD layer 624 is a dielectric layer stack including an optional PMD liner, not shown, a PMD main layer, and an optional PMD cap layer, not shown. The PMD liner is commonly silicon nitride or silicon dioxide, 10 to 100 nanometers thick, deposited by PECVD on the existing top surface of the integrated circuit 100. The PMD main layer is commonly a layer of silicon dioxide formed by a HARP process followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

Contacts 626 are formed through the PMD layer 624 to make electrical connections to the drift layer contact region 612, the input node 616, the sense node 618 and alternate sense nodes 620, through the metal silicide layers 614 if present. The contacts 626 may be formed, for example, by defining contact areas on a top surface of the PMD layer 624 with a contact photoresist pattern, not shown in, etching contact holes in the contact areas by removing PMD layer material using an RIE process to expose the metal silicide layers 614, and filling the contact holes with a contact liner metal, such as titanium, and a contact fill metal, such as tungsten, followed by removal of the contact fill metal from the top surface of the PMD layer 624 using etching and/or CMP processes.

A first level of metal interconnect lines and intra-metal dielectric (IMD) layer 628 is formed over the PMD layer 624 and contacts 626. The metal interconnect lines include an input terminal 630 which is electrically coupled to the input node 616 and the drift layer contact region 612, through the contacts 626 and metal silicide layers 614 if present. The metal interconnect lines also include a sense terminal 632 which is electrically coupled to the sense node 618 through at least one of the contacts 626 and metal silicide layers 614. If alternate sense nodes 620 are present, the metal interconnect lines include alternate sense terminals 634 which are electrically coupled to the alternate sense nodes 620.

In versions of the integrated circuit having aluminum interconnects, the first level of metal interconnect lines and IMD layer 628 may be formed by forming metal layer stack including an aluminum layer between 50 and 300 nanometers thick, and a liner metal such as titanium nitride between 2 and 20 nanometers thick, on the PMD layer 624 and contacts 626 so that the metal layer stack makes direct electrical connections to the contacts 626. A metal etch mask may be formed of photoresist over the metal layer stack so as to cover areas defined for the metal interconnect lines. Unwanted metal may be removed from the metal layer stack exposed by the metal etch mask by a metal etch process such as an RIE process using chlorine to etch the aluminum, to leave the metal interconnect lines. Following forming the metal interconnect lines the IMD layer 628 may be formed by any of several dielectric layer formation process, such as thermal decomposition of tetraethyl orthosilicate, also known as tetraethoxysilane or TEOS, or deposition of methylsilsesquioxane (MSQ) followed by thermal curing.

In versions of the integrated circuit having copper interconnects, the first level of metal interconnect lines and IMD layer 628 may be formed by a damascene process, staring with forming the IMD layer 628 of silicon dioxide or a low-k dielectric, such as organo-silicate glass (OSG) or carbon-doped silicon oxides (SiCO or CDO), by any of various dielectric layer formation processes, including chemical vapor deposition (CVD), plasma enhanced chemical vapor deposition (PECVD), low pressure chemical vapor deposition (LPCVD), thermal decomposition of TEOS, deposition and curing MSQ, or other suitable dielectric layer formation process. After the IMD layer 628 is formed, interconnect trenches are formed in the IMD layer 628 by forming an interconnect trench etch mask over the IMD layer 628 and removing dielectric material from the IMD layer 628 so as to expose the contacts 626. A metal liner between 1 and 10 nanometers thick is formed in the interconnect trenches and over the IMD layer 628 of a metal which resists copper diffusion, such as tantalum nitride. Copper is formed in the interconnect trenches on the metal liner, for example by sputtering a copper seed layer followed by electroplating copper to fill the interconnect trenches. Unwanted copper and metal liner over the IMD layer 628 may be removed by a CMP process, to leave copper metal interconnect lines.

A lower resistor, not shown, is formed in the integrated circuit 600 with a sense node and a reference node. The sense node of the lower resistor is electrically coupled to the sense terminal 632. During operation of the integrated circuit 600, an input voltage is applied to the input terminal 630 and a reference bias, for example Vss, is applied to the reference node. An electric potential in the upper resistor 610 decreases from the input node 616 to the sense node 618. The drift layer 608 depletes so that an electric potential in the drift layer 608 also decreases in a lateral direction from the central opening 606 to an outer edge below the sense node 618. An electric field in the field oxide 604 is thereby below a breakdown field value of the field oxide 604. Forming the drift layer 608 as described in reference to FIG. 6A provides that an electric field in the substrate 602 is below a breakdown field value at every location in the substrate 602.

Figure 7A:
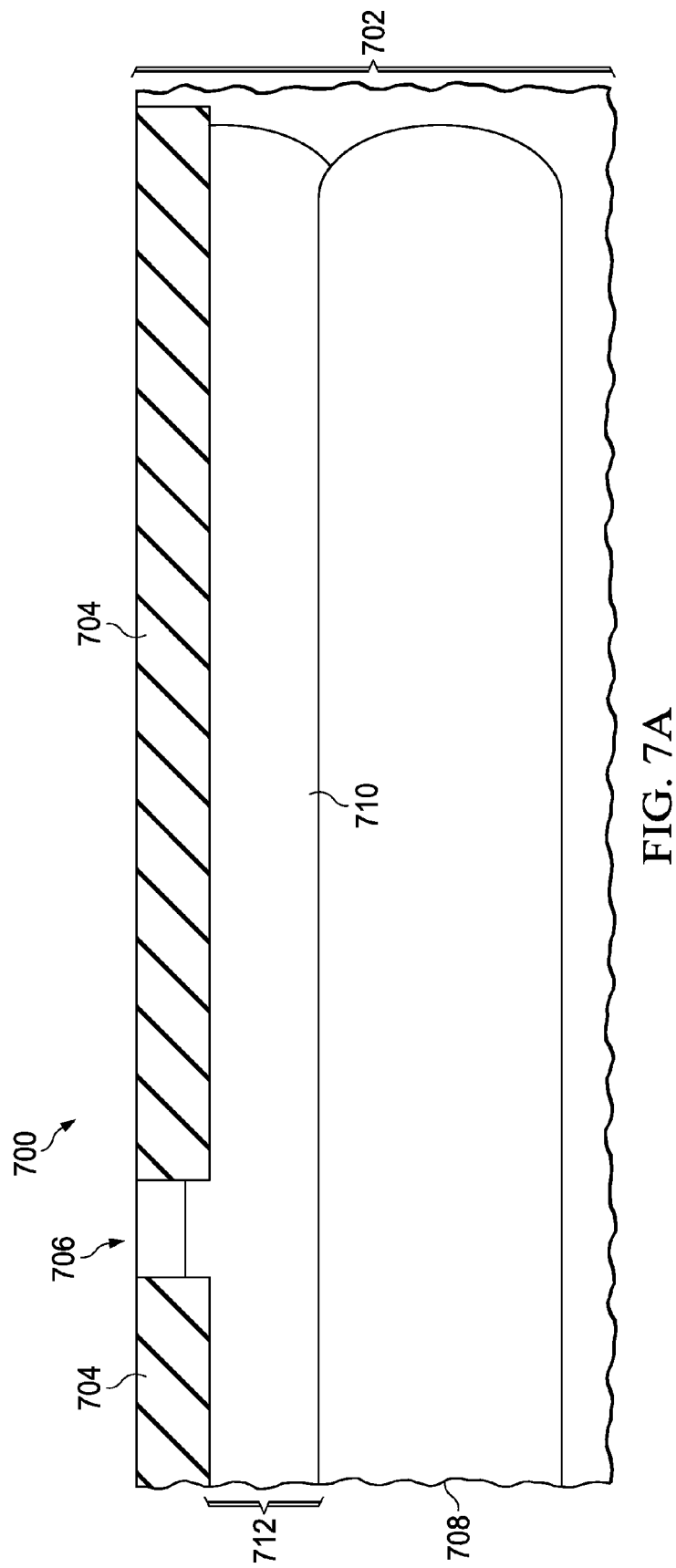
FIG. 7A through FIG. 7C are cross sections of an integrated circuit containing a voltage divider formed according to another embodiment, depicted in successive stages of fabrication.
Figure 7B:
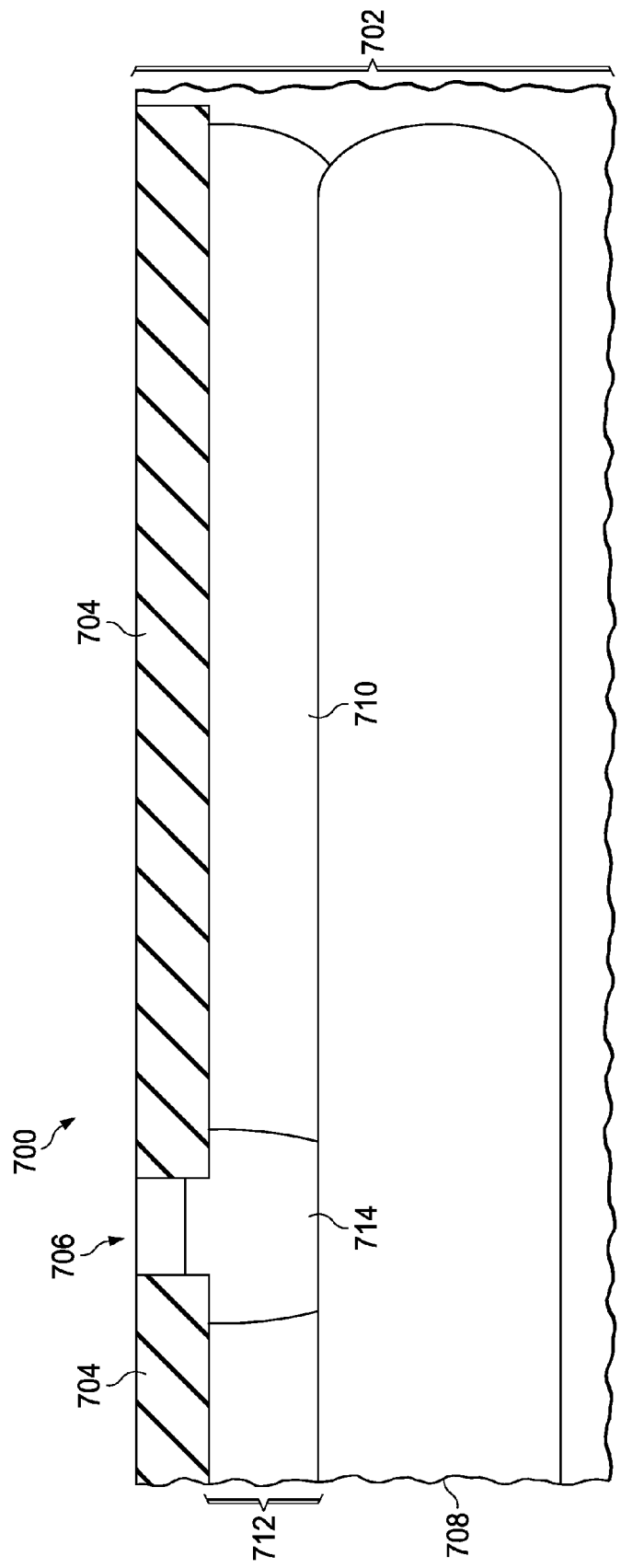
Figure 7C:
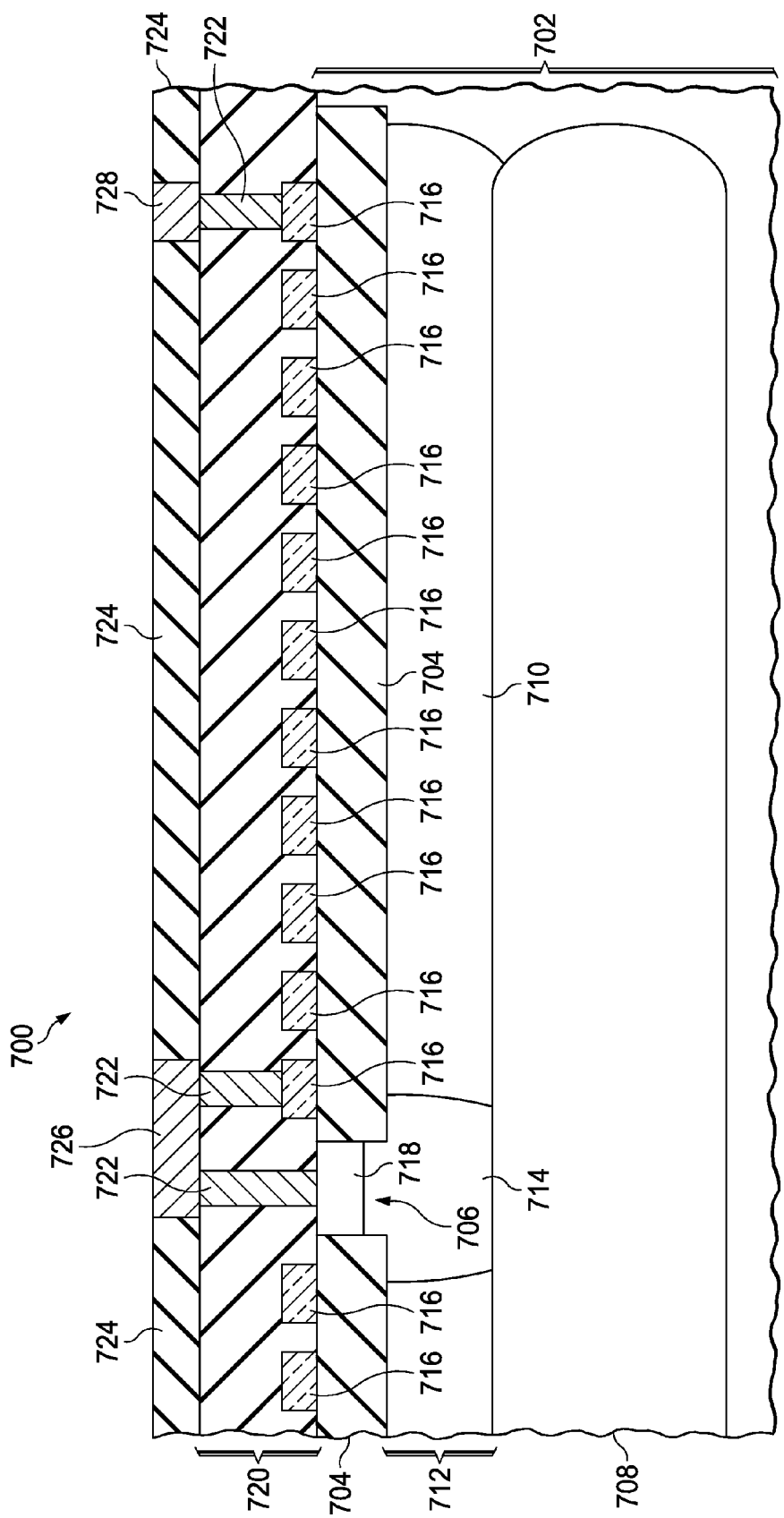

FIG. 7A through FIG. 7C are cross sections of an integrated circuit containing a voltage divider formed according to another embodiment, depicted in successive stages of fabrication. Referring to FIG. 7A, the integrated circuit 700 is formed in and on a p-type semiconductor substrate 702 as described in reference to FIG. 6A. Field oxide 704 is formed at a top surface of the substrate 702 with a central opening 706 as described in reference to FIG. 6A. An n-type buried drift layer 708 is formed under the field oxide 704 and central opening 706, for example by ion implanting n-type dopants at a dose between $6 \times 10^{11}$ atoms/cm$^2$ and $6 \times 10^{12}$ atoms/cm$^2$, followed by an anneal operation as described in reference to FIG. 6A. In one version of the instant embodiment, the drift layer 708 may be between 1 and 3 microns thick. A top surface of the drift layer 708 is at least 500 nanometers below a bottom surface of the field oxide 704. An optional p-type upper RESURF augmentation layer 710 may be formed between the field oxide 704 and the drift layer 708, for example by ion implanting p-type dopants such as boron through the field oxide 704. P-type material between the field oxide 704 and the drift layer 708, including the optional p-type upper RESURF augmentation layer 710 if formed, provides a upper RESURF layer 712. A vertically cumulative doping density of the upper RESURF layer 712 is between $3 \times 10^{11}$ atoms/cm$^2$ and $3 \times 10^{12}$ atoms/cm$^2$.

Referring to FIG. 7B, an n-type connecting region 714 is formed in the substrate 702 at the central opening 706 extending through the upper RESURF layer 712 to the drift layer 708. The connecting region 714 may be formed, for example, by ion implanting n-type dopants such as phosphorus into the substrate 702 at a dose between $1 \times 10^{15}$ atoms/cm$^2$ and $3 \times 10^{16}$ atoms/cm$^2$. The connecting region 714 provides an electrical connection to the drift layer 708.

Referring to FIG. 7C, an upper resistor 716 is formed over the field oxide 704 as described in reference to FIG. 6B. An n-type drift layer contact region 718 is formed in the central opening 706 as described in reference to FIG. 6C. The connecting region 714 provides an electrical connection between the drift layer contact region 718 and the drift layer 708. Metal silicide layers and a silicide blocking dielectric layer may be formed as described in reference to FIG. 6C, but are not shown in FIG. 7C to simplify this description. A PMD layer 720, contacts 722, an IMD layer 724 and metal interconnect lines, including an input terminal 726 and a sense terminal 728 are formed on the integrated circuit 700 as described in reference to FIG. 6D.

Operation of the integrated circuit 700 proceeds as described in reference to FIG. 6D. Forming the drift region 708 in a buried configuration may allow application of higher input voltage on the input terminal 726 compared to the configuration of FIG. 6D.

Figure 8A:
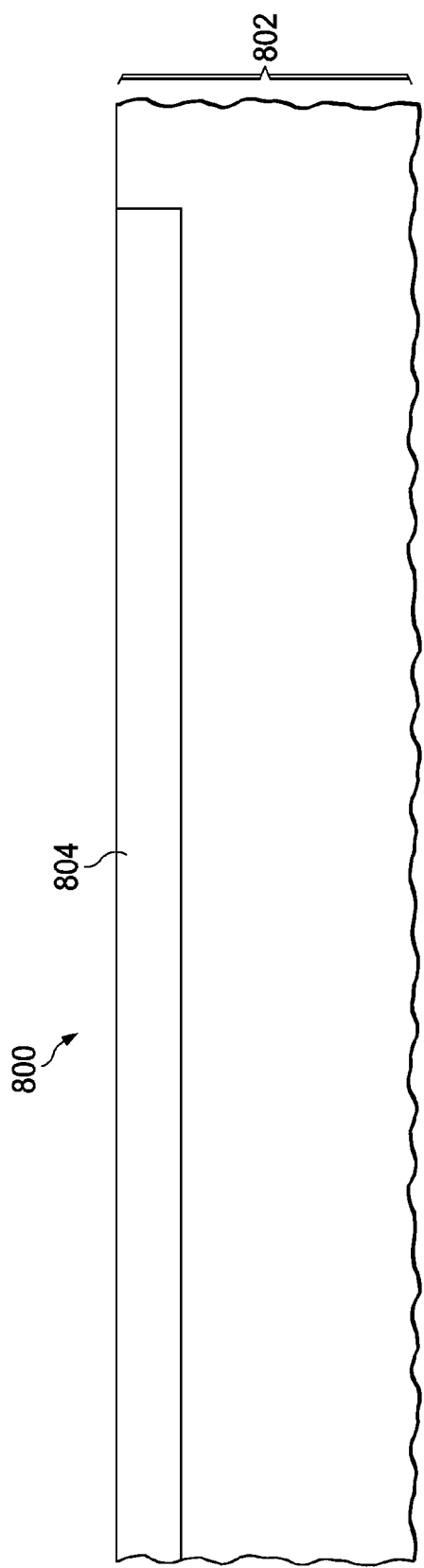

FIG. 8A through FIG. 8D are cross sections of an integrated circuit containing a voltage divider formed according to a further embodiment, depicted in successive stages of fabrication. Referring to FIG. 8A, the integrated circuit 800 is formed in and on a p-type semiconductor base substrate 802, such as a single crystal silicon wafer. An n-type buried drift layer implanted region 804 is formed in the base substrate 802 in an area defined for a drift layer, for example by ion implanting n-type dopants such as phosphorus at a dose between $6 \times 10^{11}$ atoms/cm$^2$ and $6 \times 10^{12}$ atoms/cm$^2$.

Figure 8B:
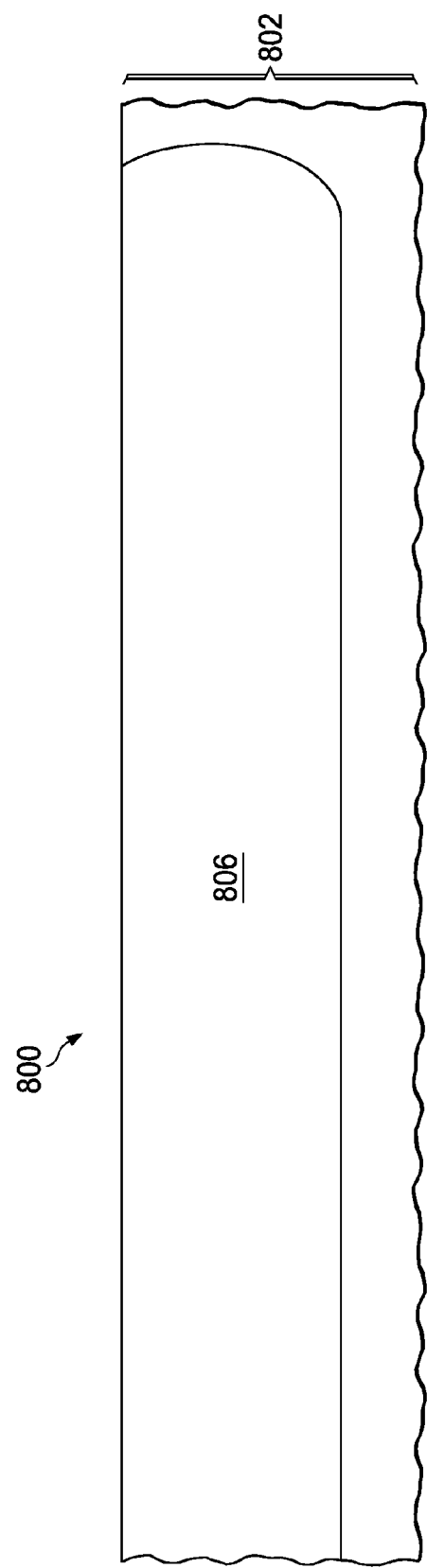

Referring to FIG. 8B, a thermal drive process is performed on the base substrate 802 which heats the base substrate 802 above 1000° C. in an anneal furnace for at least 30 minutes, causing the dopants in the buried drift layer implanted region 804 to diffuse outward and become activated, forming a buried drift layer 806. In one version of the instant embodiment, the drift layer is between 2 and 4 microns thick.

Referring to FIG. 8C, an epitaxial growth process is performed on the base substrate 802 which forms a p-type epitaxial layer 808 on the base substrate 802. In one version of the instant embodiment, the epitaxial layer 808 may be between 1 and 3 microns thick. The drift layer 806 may expand into the epitaxial layer 808 during the epitaxial growth process, as depicted in FIG. 8C. A combination of the base substrate 802 and epitaxial layer 808 forms a substrate 810 for the integrated circuit 800. The drift layer 806 may be formed concurrently with buried n-type layers of other components, not shown, in the integrated circuit 800.

Figure 8D:
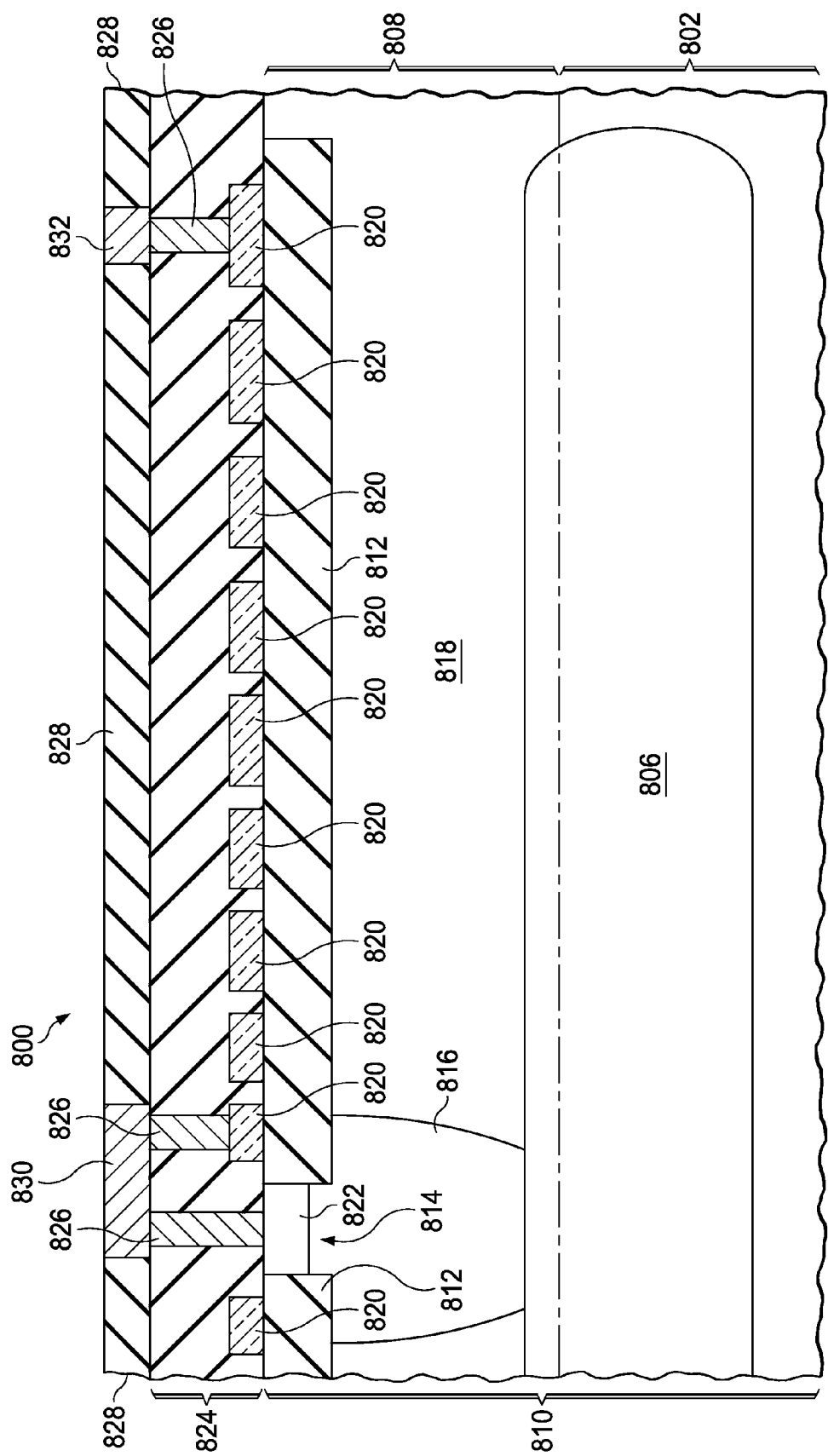

Referring to FIG. 8D, field oxide 812 with a central opening 814 is formed at a top surface of the substrate 810 in an area defined for an upper resistor, as described in reference to FIG. 6A. A top surface of the drift layer 806 is at least 1 micron below a bottom surface of the field oxide 812. An optional p-type upper RESURF augmentation layer, not shown, may be formed between the field oxide 812 and the drift layer 806, as described in reference to FIG. 7A. P-type material between the field oxide 812 and the drift layer 806, including the optional p-type upper RESURF augmentation layer if formed, provides a upper RESURF layer 818. A vertically cumulative doping density of the upper RESURF layer 818 is between $3 \times 10^{11}$ atoms/cm$^2$ and $3 \times 10^{12}$ atoms/cm$^2$. An n-type connecting region 816 is formed in the substrate 810 at the central opening 814 extending through the upper RESURF layer 818 to the drift layer 806, as described in reference to FIG. 7B.

An upper resistor 820 is formed over the field oxide 812 around the central opening 814 as described in reference to FIG. 6B. An n-type drift layer contact region 822 is formed in the central opening 814 as described in reference to FIG. 6C. Metal silicide layers and a silicide blocking dielectric layer may be formed as described in reference to FIG. 6C, but are not shown in FIG. 8D to simplify this description. A PMD layer 824, contacts 826, an IMD layer 828 and metal interconnect lines, including an input terminal 830 and a sense terminal 832 are formed on the integrated circuit 800 as described in reference to FIG. 6D.

Operation of the integrated circuit 800 proceeds as described in reference to FIG. 6D. Forming the drift layer 806 in a buried configuration may allow application of higher input voltage on the input terminal 830 compared to the configuration of FIG. 6D. Forming the drift layer 806 concurrently with buried n-type layers of other components in the integrated circuit 800 may advantageously reduce a fabrication cost of the integrated circuit 800.

Figure 9A:
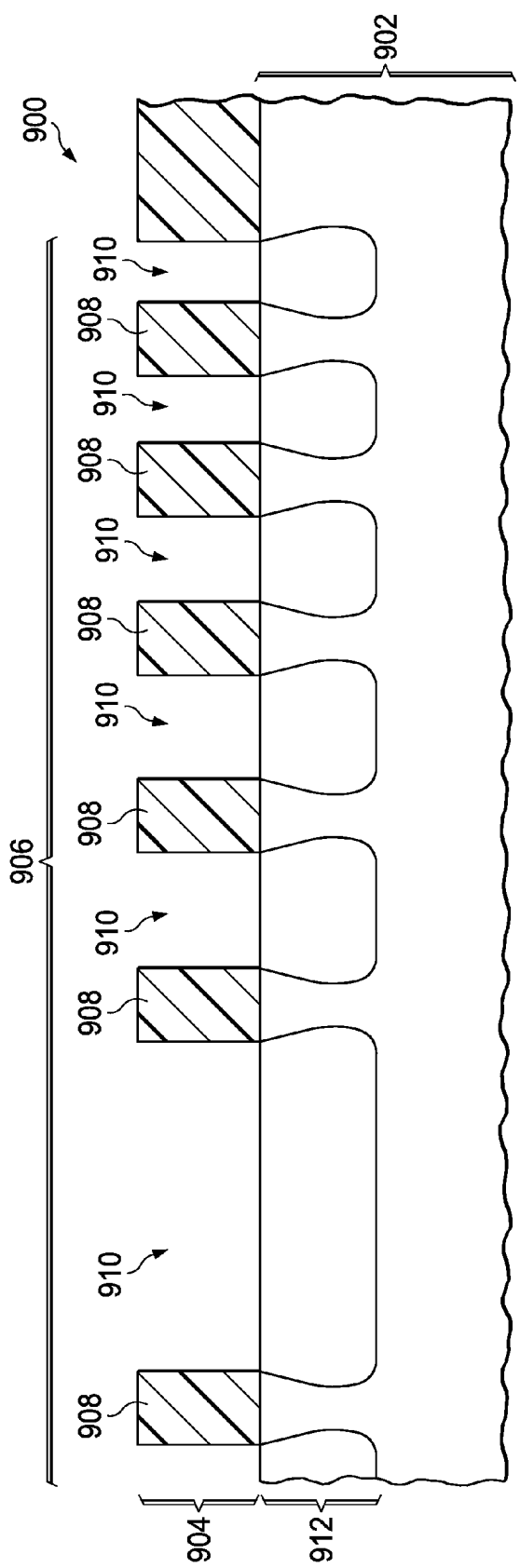
FIG. 9A through FIG. 9C are cross sections of an integrated circuit having a voltage divider with a drift layer formed according to an embodiment, depicted in successive stages of fabrication of a drift layer under an upper resistor of the voltage divider.
Figure 9B:
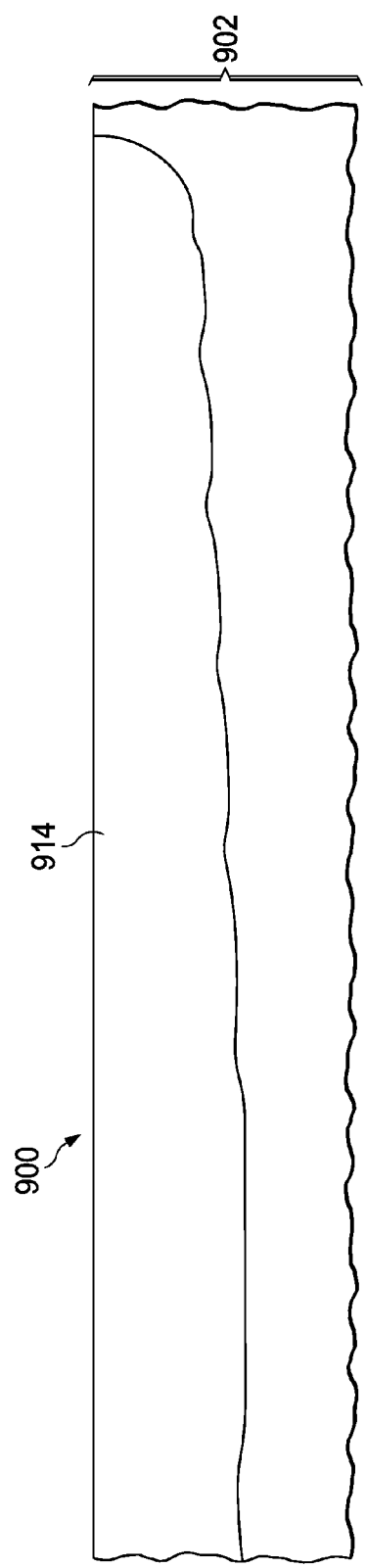
Figure 9C:
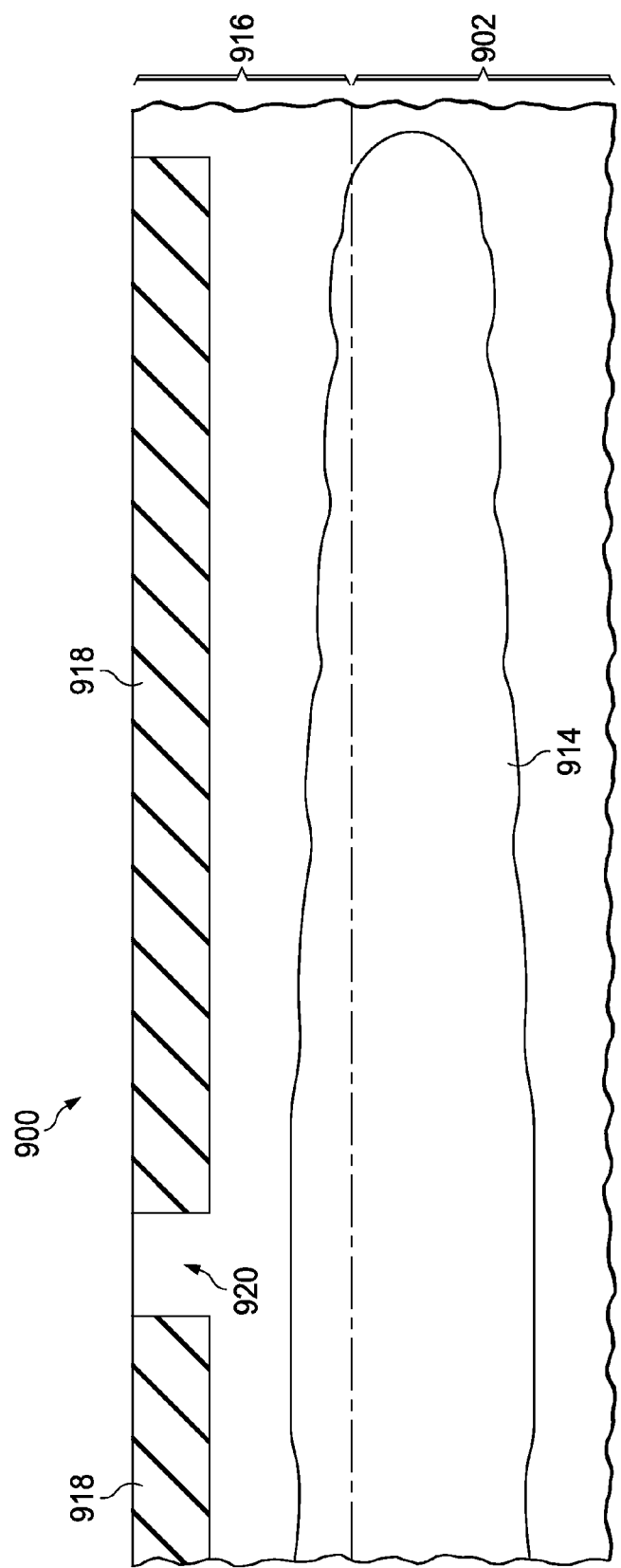

FIG. 9A through FIG. 9C are cross sections of an integrated circuit having a voltage divider with a drift layer formed according to an embodiment, depicted in successive stages of fabrication of a drift layer under an upper resistor of the voltage divider. Referring to FIG. 9A, the integrated circuit 900 is formed in and on a p-type semiconductor base substrate 902 as described in reference to FIG. 8A. A segmented, graded drift layer implant mask 904 is formed over the base substrate 902 so as to expose an area 906 for ion implanting n-type dopants to form a segmented, graded n-type drift layer. The drift layer implant mask 904 includes segmenting elements 908 in the ion implant area 906. In one version of the instant embodiment, the drift layer implant mask 904 may include photoresist, for example between 0.3 and 1 microns thick. In another version, the drift layer implant mask 904 may be formed of dielectric material such as silicon dioxide and/or silicon nitride by depositing one or more layers of the dielectric materials over the base substrate 902, forming a photoresist pattern over the dielectric layers to cover areas of the drift layer implant mask 904, and removing unwanted dielectric material from the dielectric layers using the photoresist pattern as an etch mask, so as to leave dielectric material under the photoresist pattern to form the drift layer implant mask 904. The segmenting elements 908 may be substantially equal in size as depicted in FIG. 9A or may be of varying size. The segmenting elements 908 may be of any shape and/or orientation, such as radially oriented tapered trapezoids, nested arcs or round pillars. Open areas 910 in the drift layer implant mask 904 may be of sequentially increasing size as depicted in FIG. 9A, or may be substantially equal in size.

A drift layer ion implant operation is performed on the integrated circuit 900 which implants n-type dopants such as phosphorus into the base substrate 902 through the open areas 910 of the drift layer implant mask 904 to form a segmented, graded drift layer implanted region 912. The term "segmented" in the description of the drift layer implanted region 912 denotes that the drift layer implanted region 912 is spatially segmented as a result of implanting the dopants through open areas 910 defined by the segmenting elements 908. The term "graded" in the description of the drift layer implanted region 912 denotes that the drift layer implanted region 912 has a lateral gradient in an average density of the implant dopants, resulting from the open areas 910 sequentially increasing in size, and/or from the segmenting elements 908 sequentially decreasing in size. In an alternate version of the instant embodiment, the drift layer implanted region 912 may be segmented, but not necessarily graded, so that implanted segments of the drift layer implanted region 912 are substantially equal in size and spacing.

Referring to FIG. 9B, an anneal operation is performed on the base substrate 902 which heats the base substrate 902 above 1000° C. in an anneal furnace for at least 30 minutes, causing the dopants in the drift layer implanted region 912 to diffuse outward and become activated, forming a segmented, graded drift layer 914. The term "segmented" in the description of the drift layer 914 denotes that the drift layer 914 was formed from a segmented implanted region. The term "graded" in the description of the drift layer 914 denotes that the drift layer 914 has a lateral gradient in an average density of the implant dopants, resulting from formation from a graded implanted layer. In one version of the instant embodiment, the drift layer 914 may be segmented but not necessarily graded.

Referring to FIG. 9C, a p-type epitaxial layer 916 is formed on the base substrate 902, as described in reference to FIG. 8C. The drift layer 914 may extend into the epitaxial layer 916 as shown in FIG. 9C. Field oxide 918 is subsequently formed over the drift layer 914 at a top surface of the epitaxial layer 916 with a central opening 920. In one version of the instant embodiment, not depicted in FIG. 9C, one or more of the implanted segments of the drift layer implanted region 912 may not contact other implanted segments of the drift layer implanted region 912 after the epitaxial layer 916 is formed; during operation of the integrated circuit 900, depletion regions from the segments of the drift layer 914 overlap.

Figure 10:
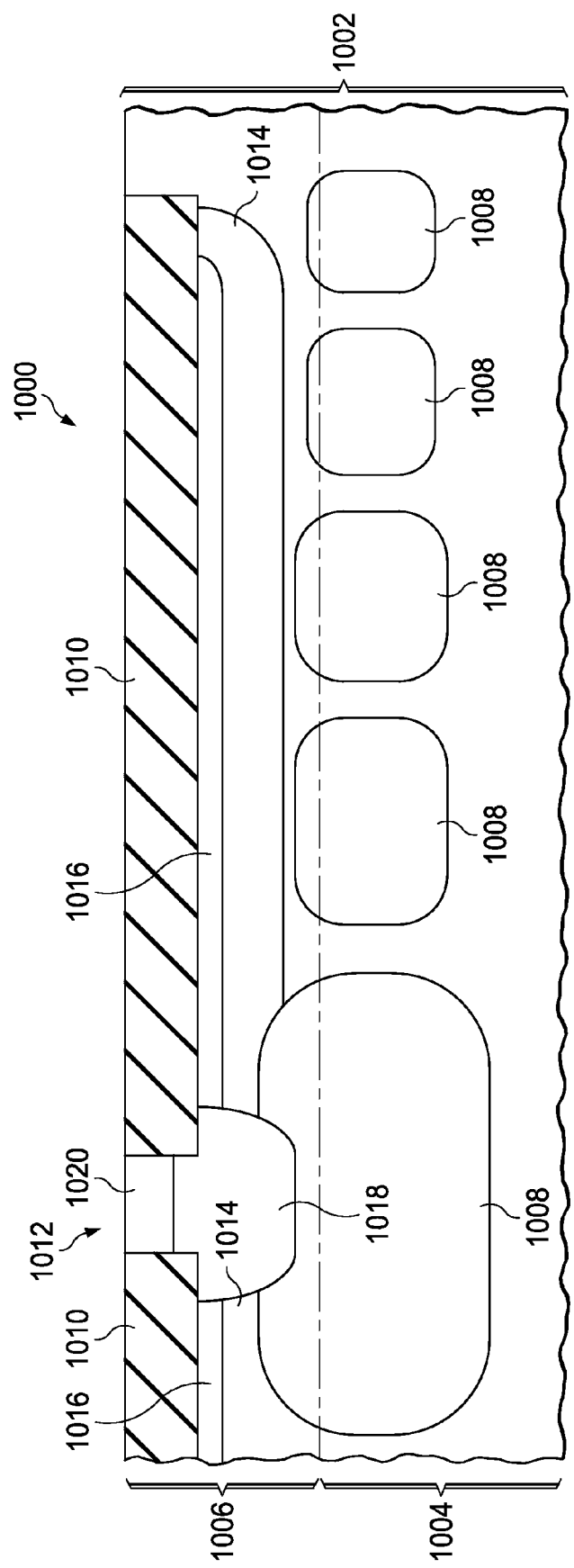
FIG. 10 is a cross section of an integrated circuit having a voltage divider with a drift layer formed according to a further embodiment.

FIG. 10 is a cross section of an integrated circuit having a voltage divider with a drift layer formed according to a further embodiment. The integrated circuit 1000 is formed in and on a semiconductor substrate 102 which includes a p-type base substrate 104 and a p-type epitaxial layer 106. An n-type segmented, graded buried lower drift layer 108 is formed in the base substrate layer 104 and extends into the epitaxial layer 106. In one version of the instant embodiment, the drift layer 108 may include one or more disconnected segments, as depicted in FIG. 10; during operation of the integrated circuit 1000, depletion regions from the segments of the drift layer 108 overlap.

Field oxide 110 is formed at a top surface of the epitaxial layer 106 over the lower drift layer 108 with a central opening 112. An n-type upper drift layer 114 is formed in the epitaxial layer 106 so as to contact the lower drift layer 108 under the central opening 112 and so as to be separated from the lower drift layer 108 by a p-type region of the epitaxial layer 106 at an outer edge of the lower drift layer 108. A p-type upper RESURF layer 116 is formed in the epitaxial layer 106 between the field oxide 110 and the upper drift layer 114. The upper RESURF layer 116 may be formed concurrently with p-type implants in areas defined for NMOS transistors, not shown, in the integrated circuit 1000. An n-type connecting region 118 is formed in the epitaxial layer 106 at the central opening 112 extending through the upper RESURF layer 116 to the upper drift layer 114 and the lower drift layer 108. An n-type drift layer contact region 120 is formed in the central opening 112, so that an electrical connection is provided from the top surface of the epitaxial layer 106 in the central opening 112 to the upper drift layer 114 and the lower drift layer 108.

Figure 11:
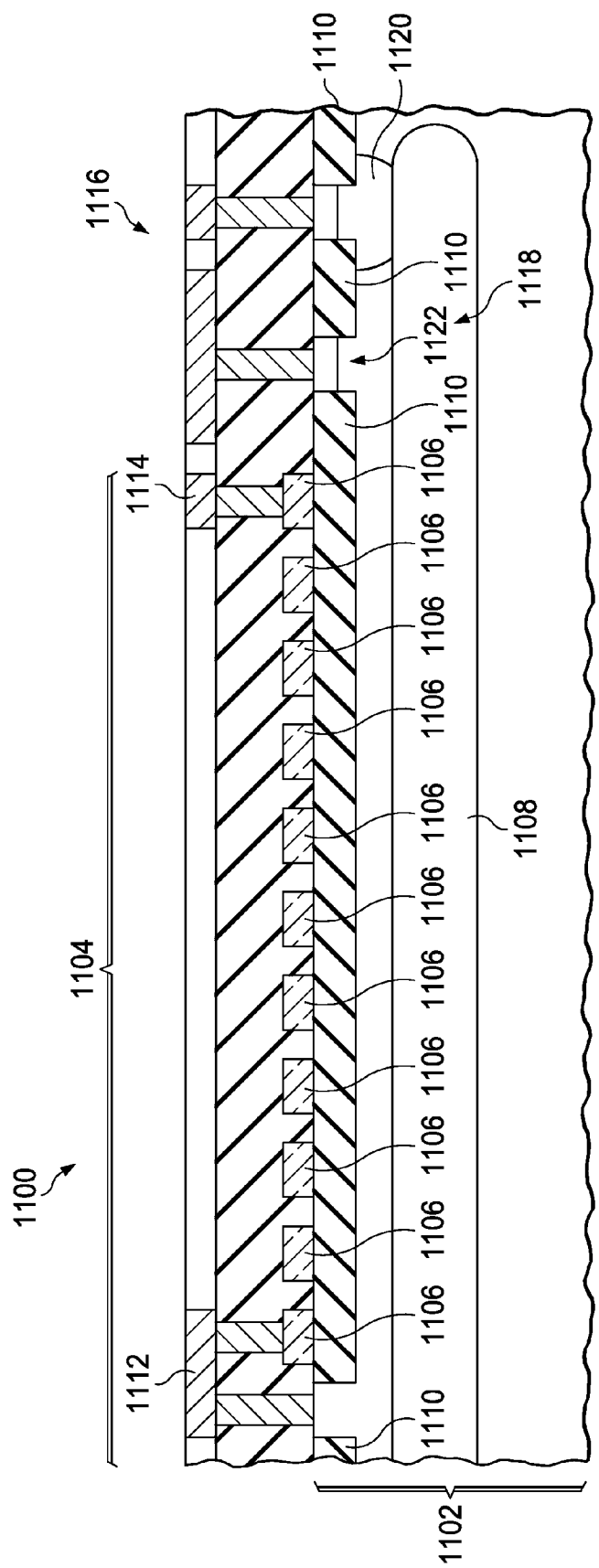
FIG. 11 through FIG. 13 are cross sections of integrated circuits containing voltage dividers with drift layers under upper resistors, in which the drift layers are integrated with transistors to provide modulation means for voltages applied to input nodes of the voltage dividers.
Figure 12:
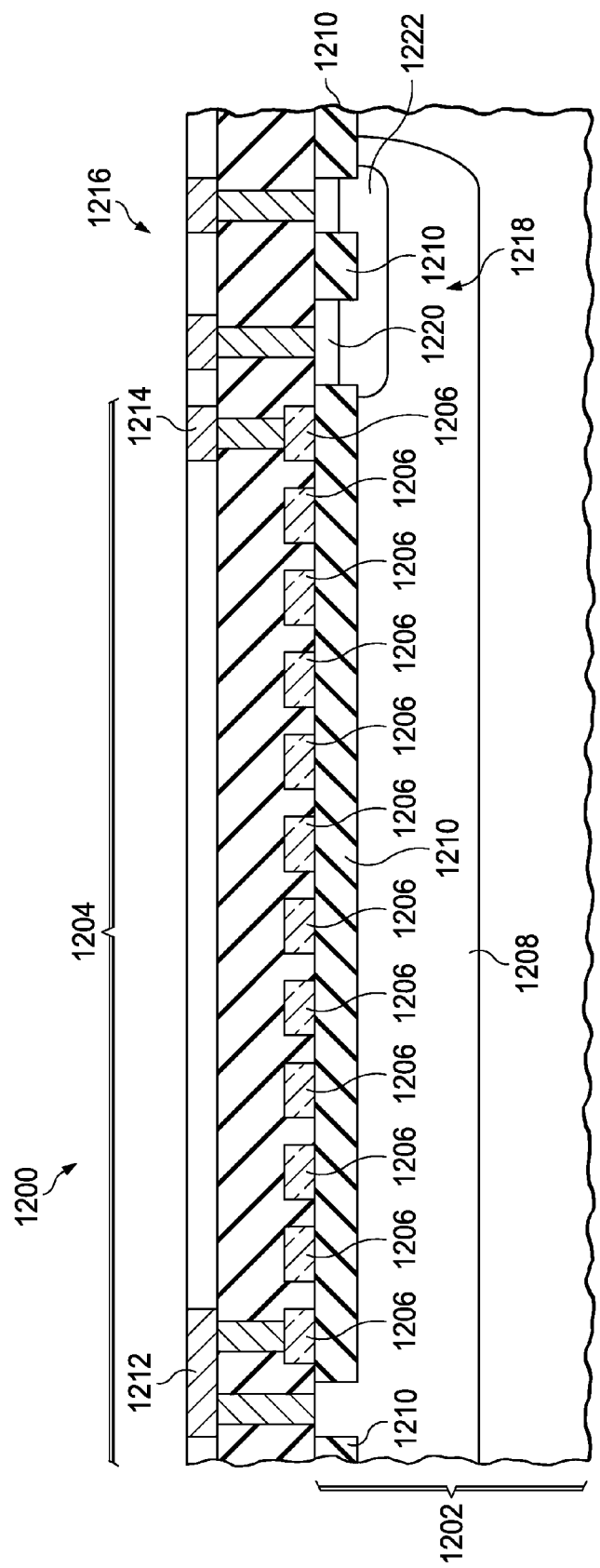
Figure 13:
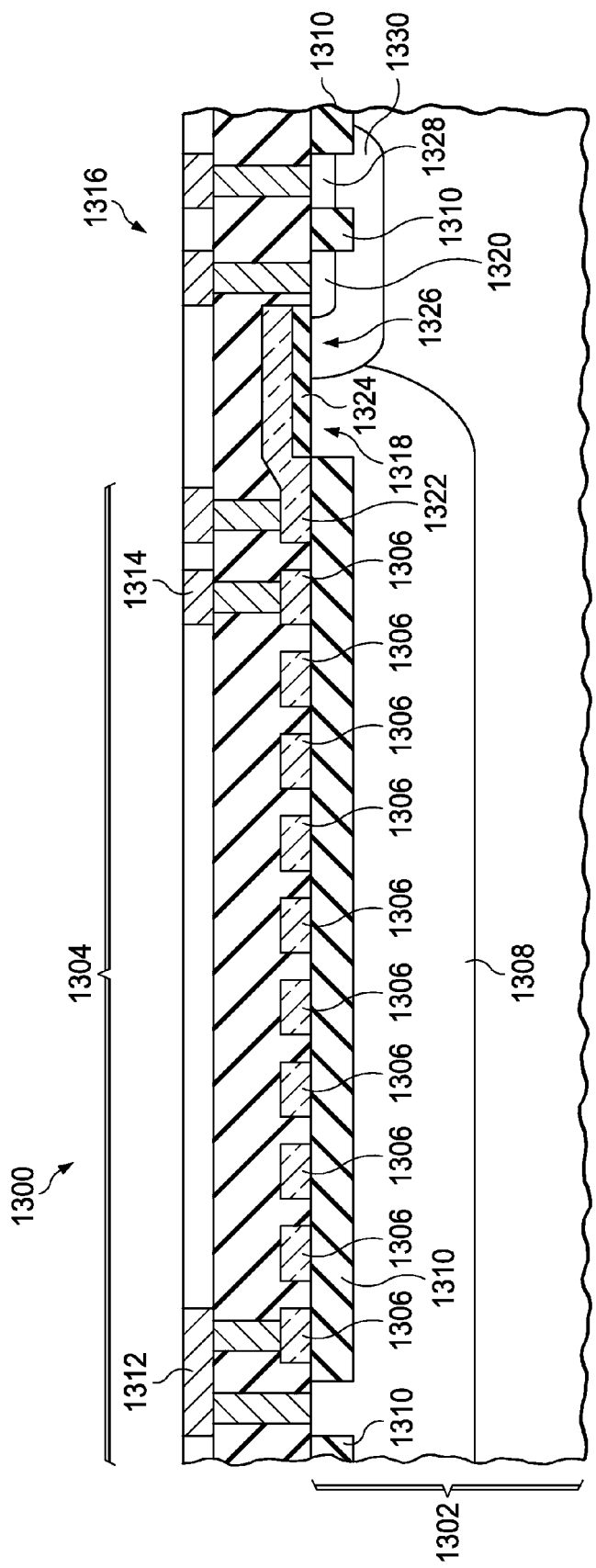

FIG. 11 through FIG. 13 are cross sections of integrated circuits containing voltage dividers with drift layers under upper resistors, in which the drift layers are integrated with transistors, for example to provide modulation means for voltages applied to input nodes of the voltage dividers. Referring to FIG. 11, an integrated circuit 200 is formed in and on a substrate 1102. The integrated circuit 200 has an area 1104 defined for an upper resistor 1106 of the voltage divider. A drift layer 1108 is formed under field oxide 1110, for example, as described according to one of the embodiments recited herein. An input terminal 1112 is electrically coupled to the upper resistor 1106 and the drift layer 1108, and a sense terminal 1114 is electrically coupled to the upper resistor 1106, as described according to one of the embodiments recited herein. A junction field effect transistor (JFET) 1116 is formed in and on the substrate 1102 at an outer edge of the drift layer 1108, which is the edge proximate to the sense terminal 1114. The JFET 1116 includes an n-type channel region 1118 which extends from or contacts the drift layer 1108, an n-type source region 1120 coupled to the channel region 1118 and a p-type gate region 1122 abutting the channel region 1118.

Referring to FIG. 12, an integrated circuit 1200 is formed in and on a substrate 1202. The integrated circuit 1200 has an area 1204 defined for an upper resistor 1206 of the voltage divider. A drift layer 1208 is formed under field oxide 1210, for example, as described according to one of the embodiments recited herein. An input terminal 1212 is electrically coupled to the upper resistor 1206 and the drift layer 1208, and a sense terminal 1214 is electrically coupled to the upper resistor 1206, as described according to one of the embodiments recited herein. A bipolar transistor 1216 is formed in and on the substrate 1202 at an outer edge of the drift layer 1208. The bipolar transistor 1216 includes an n-type collector region 1218 which extends from or contacts the drift layer 1208, an n-type emitter layer 1220 proximate to the collector layer 1218 and a p-type base region 1222 which extends between the collector region 1218 and the emitter layer 1220.

Referring to FIG. 13, an integrated circuit 1300 is formed in and on a substrate 1302. The integrated circuit 1300 has an area 1304 defined for an upper resistor 1306 of the voltage divider. A drift layer 1308 is formed under field oxide 1310, for example, as described according to one of the embodiments recited herein. An input terminal 1312 is electrically coupled to the upper resistor 1306 and the drift layer 1308, and a sense terminal 1314 is electrically coupled to the upper resistor 1306, as described according to one of the embodiments recited herein. An NMOS transistor 1316 is formed in and on the substrate 1302 at an outer edge of the drift layer 1308. The NMOS transistor 1316 includes an n-type drain region 1318 at an outer edge of the drift layer 1308, an n-type source layer 1320 and a gate 1322 on a gate dielectric layer 1324 over a p-type channel region 1326 between the drain region 1318 and the source layer 1320. The gate 1322 may be formed concurrently with the upper resistor 1306. The gate 1322 may extend onto the field oxide 1310 adjacent to the drain region 1318 to provide a field plate. A p-type substrate contact layer 1328 may be formed in a p-type well 1330 containing the channel region 1326.

Figure 14:
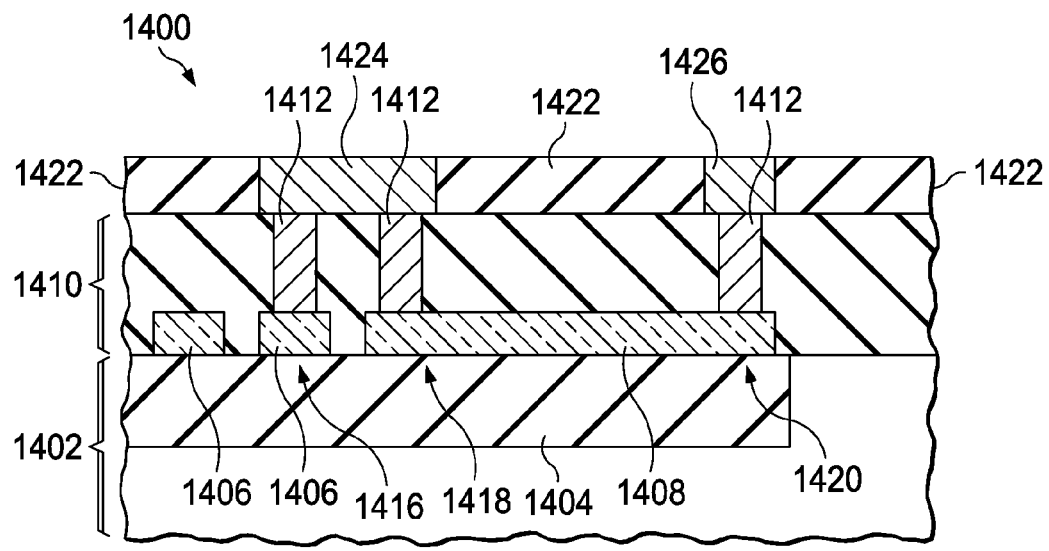
FIG. 14 through FIG. 16 are cross sections of integrated circuits containing voltage dividers formed according to embodiments, depicting different lower resistors.
Figure 15:
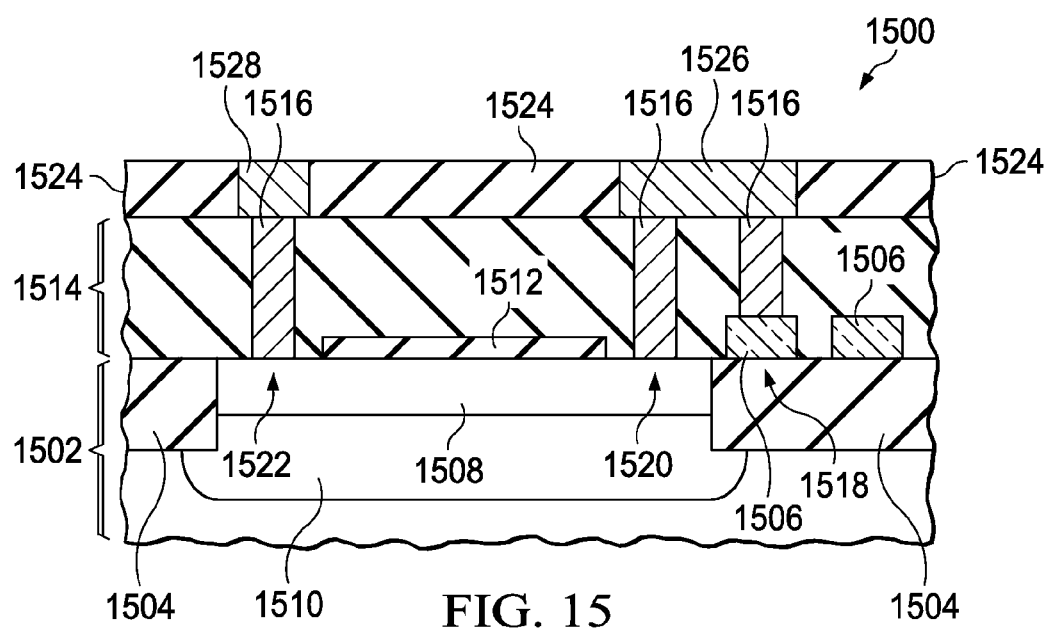
Figure 16:
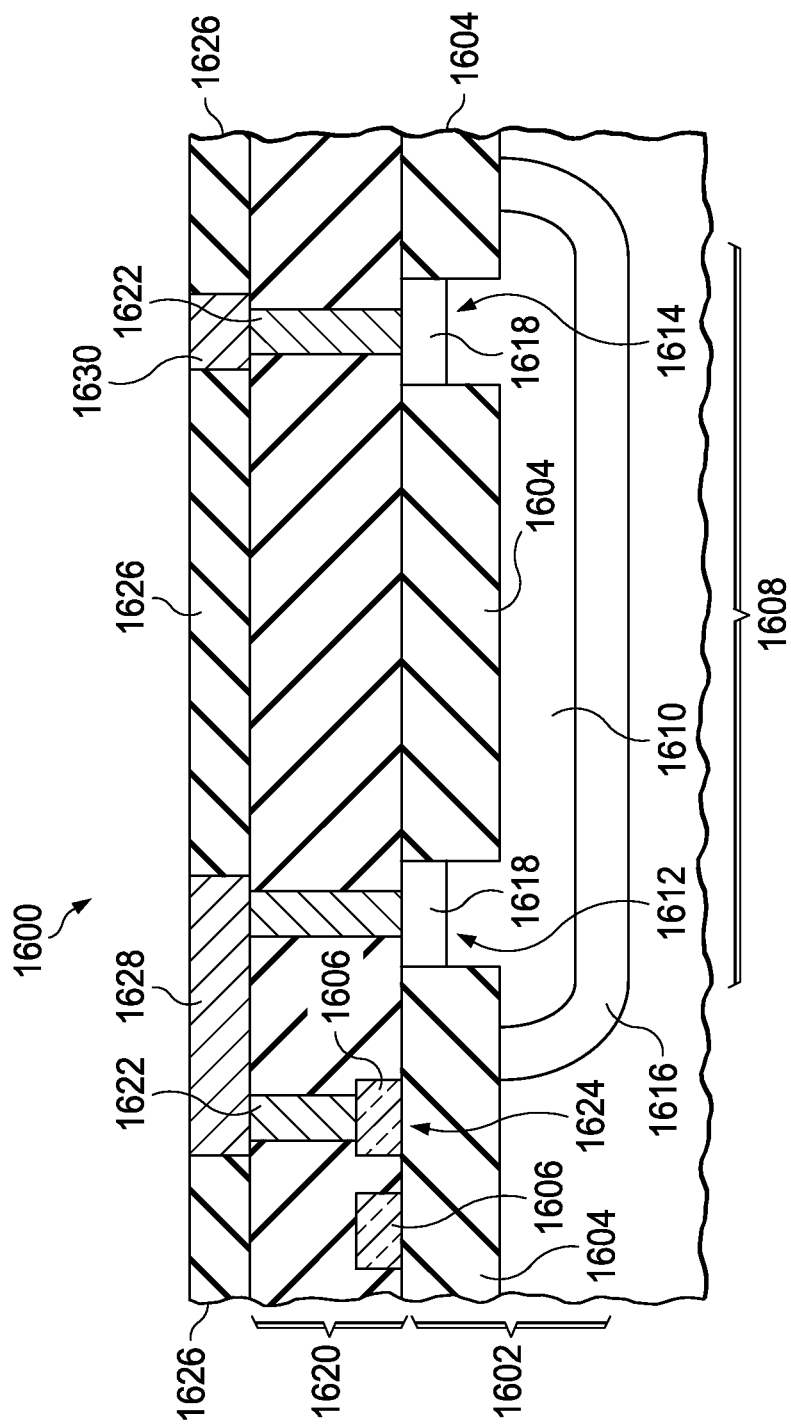

FIG. 14 through FIG. 16 are cross sections of integrated circuits containing voltage dividers formed according to embodiments, depicting different lower resistors. Referring to FIG. 14, the integrated circuit 1400 is formed in an on a semiconductor substrate 1402. Field oxide 1404 is formed at a top surface of the substrate 1402 in an area defined for an upper resistor of the voltage divider, and in an area defined for a lower resistor of the voltage divider. In one version of the instant embodiment, the area defined for the upper resistor may abut the area defined for the lower resistor. An upper resistor 1406 is formed over the field oxide 1404 of gate material. A lower resistor 1408 is formed over the field oxide 1404 of gate material concurrently with the upper resistor. Metal silicide layers and a silicide blocking dielectric layer may be formed as described in reference to FIG. 6C, but are not shown in FIG. 14 to simplify this description. In one version of the instant embodiment, metal silicide is not formed on a body region of the lower resistor 1408.

A PMD layer 1410 is formed over an existing top surface of the integrated circuit 1400. Contacts 1412 are formed in the PMD layer 1410 at a sense node 1414 of the upper resistor 1406, a sense node 1418 of the lower resistor 1408 and a reference node 1420 of the lower resistor 1408. An IMD layer 1422 and metal interconnect lines are formed over the PMD layer 1410. The metal interconnect lines include a sense terminal 1424 which is electrically coupled to the sense node 1416 of the upper resistor 1406 and the sense node 1418 of the lower resistor 1408, and a reference terminal 1426 which is electrically coupled to the reference node 1420 of the lower resistor 1408.

Referring to FIG. 15, the integrated circuit 1500 is formed in an on a semiconductor substrate 1502. Field oxide 1504 is formed at a top surface of the substrate 1502 in an area defined for an upper resistor of the voltage divider. The field oxide 1504 is formed so as to have an opening in an area defined for a lower resistor of the voltage divider. In one version of the instant embodiment, the area defined for the upper resistor may abut the area defined for the lower resistor. An upper resistor 1506 is formed over the field oxide 1504 of gate material.

A lower resistor 1508 is formed in the opening the field oxide 1504 of substrate doped at a desired conductivity type and density. For example, the lower resistor 1508 may be n-type, between 150 and 250 nanometers deep, with an average doping density between $2 \times 10^{20}$ cm$^{-3}$ and $1 \times 10^{21}$ cm$^{-3}$ and a sheet resistance between 5 and 20 ohms/square. In one version of the instant embodiment, the lower resistor 1508 may be formed concurrently with source/drain layers of MOS transistors, not shown, in the integrated circuit 1500. A well 1510 of an opposite conductivity type from the lower resistor 1508 may be formed under the lower resistor 1508. A silicide blocking dielectric layer 1512 is formed over at least a body section of the lower resistor 1508 so as to prevent formation of metal silicide on the body section. Metal silicide layers may be formed as described in reference to FIG. 6C, but are not shown in FIG. 15 to simplify this description.

A PMD layer 1514 is formed over an existing top surface of the integrated circuit 1500. Contacts 1516 are formed in the PMD layer 1514 at a sense node 1518 of the upper resistor 1506, a sense node 1520 of the lower resistor 1508 and a reference node 1522 of the lower resistor 1508. An IMD layer 1524 and metal interconnect lines are formed over the PMD layer 1514. The metal interconnect lines include a sense terminal 1526 which is electrically coupled to the sense node 1518 of the upper resistor 1506 and the sense node 1518 of the lower resistor 1508, and a reference terminal 1528 which is electrically coupled to the reference node 1522 of the lower resistor 1508.

Referring to FIG. 16, the integrated circuit 1600 is formed in an on a semiconductor substrate 1602. Field oxide 1604 is formed at a top surface of the substrate 1602 in an area defined for an upper resistor of the voltage divider. The field oxide 1604 is formed in an area defined for a lower resistor of the voltage divider so as to have an opening for a sense node of the lower resistor and an opening for a reference node of the lower resistor. In one version of the instant embodiment, the area defined for the upper resistor may abut the area defined for the lower resistor. An upper resistor 1606 is formed over the field oxide 1604 of gate material.

A lower resistor 1608 is formed in a resistor well 1610 in the substrate 1602 under the field oxide 1604 and extending up to the top surface of the substrate 1602 at the sense node 1612 and the reference node 1614. The resistor well 1610 is formed to have a desired conductivity type and density. For example, the resistor well may be n-type, with a bottom surface between 300 nanometers and 600 nanometers below a bottom surface of the field oxide 1604, with an average doping density between $2 \times 10^{17}$ cm$^{-3}$ and $4 \times 10^{18}$ cm$^{-3}$ and a sheet resistance between 300 and 500 ohms/square. In one version of the instant embodiment, the resistor well 1610 may be formed concurrently with wells of MOS transistors, not shown, in the integrated circuit 1600. An isolation well 1616 of an opposite conductivity type from the resistor well 1610 may be formed under the resistor well 1610. Optional resistor contact layers 1618 of a same conductivity type as the resistor well 1610 may be formed in the substrate 1602 at the sense node 1612 and the reference node 1614 of the lower resistor 1608. The resistor contact layers 1618 may be formed concurrently with source/drain layers of MOS transistors, not shown) in the integrated circuit 1600. Metal silicide layers may be formed as described in reference to FIG. 6C, but are not shown in FIG. 16 to simplify this description.

A PMD layer 1620 is formed over an existing top surface of the integrated circuit 1600. Contacts 1622 are formed in the PMD layer 1620 at a sense node 1624 of the upper resistor 1606, the sense node 1612 and the reference node 1614 of the lower resistor 1608. An IMD layer 1626 and metal interconnect lines are formed over the PMD layer 1620. The metal interconnect lines include a sense terminal 1628 which is electrically coupled to the sense node 1624 of the upper resistor 1606 and the sense node 1612 of the lower resistor 1608, and a reference terminal 1630 which is electrically coupled to the reference node 1614 of the lower resistor 1608.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a substrate comprising a semiconductor having a first conductivity type;
    field oxide formed at a surface of said substrate; and
    a voltage divider, including:
        an upper resistor located over said field oxide and disposed around a central opening in said field oxide, said upper resistor having an input node adjacent to said central opening in said field oxide and a sense node at an outer edge of said upper resistor;
        a drift layer located in said substrate under said upper resistor and said central opening in said field oxide, said drift layer having a second conductivity type opposite from said first conductivity type;
        an input terminal electrically coupled to said input node of said upper resistor and electrically coupled to said drift layer through said central opening in said field oxide;
        a sense terminal electrically coupled to said sense node of said upper resistor; and a lower resistor electrically coupled to said sense terminal at one end of said lower resistor and to a reference node at an opposite end of said lower resistor.

2. The integrated circuit of claim 1, in which said upper resistor has a spiral configuration.

3. The integrated circuit of claim 2, in which said upper resistor has a multi-fingered spiral configuration.

4. The integrated circuit of claim 1, in which said upper resistor includes unsilicided polysilicon.

5. The integrated circuit of claim 1, in which said drift layer physically contacts said field oxide.

6. The integrated circuit of claim 1, in which said drift layer is segmented.

7. The integrated circuit of claim 6, in which said drift layer is graded.

8. The integrated circuit of claim 1, in which a transistor is disposed adjacent to said drift layer so that said transistor is electrically coupled to said drift layer.

9. The integrated circuit of claim 1, in which:
said substrate is p-type; and
said drift layer is n-type.

10. The integrated circuit of claim 1, wherein the lower resistor is a discrete resistor comprising a gate material.

11. The integrated circuit of claim 1, wherein the lower resistor is a discrete resistor comprising a doped region of the substrate.

12. An integrated circuit, comprising:
a substrate comprising a semiconductor having a first conductivity type;
field oxide formed at a surface of said substrate; and
a voltage divider, including:
an upper resistor located over said field oxide and disposed around a central opening in said field oxide, said upper resistor having an input node adjacent to said central opening in said field oxide and a sense node at an outer edge of said upper resistor;
a drift layer located in said substrate under said upper resistor and said central opening in said field oxide, said drift layer having a second conductivity type opposite from said first conductivity type;
an input terminal electrically coupled to said input node of said upper resistor and electrically coupled to said drift layer through said central opening in said field oxide;
a sense terminal electrically coupled to said sense node of said upper resistor; and
a lower resistor electrically coupled to said sense terminal at one end of said lower resistor and to a reference node at an opposite end of said lower resistor, wherein said drift layer is separated from said field oxide by a upper RESURF layer, said upper RESURF layer having an opposite conductivity type from said drift layer.

13. A process of forming an integrated circuit containing a voltage divider, comprising steps:
providing a substrate comprising a semiconductor having a first conductivity type;
forming field oxide at a surface of said substrate, so that said field oxide has a central opening which exposes said substrate in said central opening;
forming a drift layer in said substrate under said field oxide and under said central opening in said field oxide, said drift layer having a a second conductivity type opposite from said first conductivity type;
forming an upper resistor over said field oxide, so that said upper resistor is disposed around said central opening, said upper resistor having an input node adjacent to said central opening and a sense node at an outer edge of said upper resistor;
forming a lower resistor of said voltage divider, said lower resistor having a sense node at one end of said lower resistor and a reference node at an opposite end of said lower resistor;
forming an input terminal of said voltage divider, said input terminal being electrically coupled to said input node of said upper resistor, and being electrically coupled to said drift layer;
forming a sense terminal of said voltage divider, said sense terminal being electrically coupled to said sense node of said upper resistor, and being electrically coupled to said sense node of said lower resistor; and
forming a reference terminal of said voltage divider, said reference terminal being electrically coupled to said reference node of said lower resistor.

14. The process of claim 13, in which said upper resistor has a spiral configuration.

15. The process of claim 14, in which said upper resistor has a multi-fingered spiral configuration.

16. The process of claim 13, in which said step of forming said upper resistor includes:
forming a layer of polysilicon on said field oxide;
patterning said polysilicon layer to form said upper resistor;
forming a silicide blocking dielectric layer over said upper resistor, said silicide blocking dielectric layer exposing said input node and said sense node of said upper resistor; and
forming metal silicide layers on said input node and said sense node of said upper resistor.

17. The process of claim 13, in which said step of forming said drift layer is includes ion implanting dopants into said substrate so that said drift layer physically contacts said field oxide.

18. The process of claim 13, in which said step of forming said drift layer is performed so that said drift layer is separated from said field oxide by a upper RESURF layer, said upper RESURF layer having an opposite conductivity type from said drift layer.

19. The process of claim 13, in which said step of forming said drift layer includes:
forming a segmented drift layer implant mask with segmenting elements; and
implanting dopants through open areas of said drift layer implant mask so as to form a segmented drift layer implanted region.

20. The process of claim 19, in which:
said segmented drift layer implant mask is graded; and
said segmented drift layer implanted region is graded.

21. The process of claim 13, further including forming a transistor adjacent to said drift layer so that said transistor is electrically coupled to said drift layer.

22. The process of claim 13, in which:
said substrate is p-type; and
said drift layer is n-type.

* * * * *